United States Patent
Chang et al.

(10) Patent No.: US 9,529,236 B2
(45) Date of Patent: Dec. 27, 2016

(54) PIXEL STRUCTURE AND DISPLAY PANEL

(71) Applicant: AU Optronics Corp., Hsin-Chu (TW)

(72) Inventors: Ming-Haw Chang, Hsin-Chu (TW); Chun-Yi Chiang, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 16 days.

(21) Appl. No.: 14/829,652

(22) Filed: Aug. 19, 2015

(65) Prior Publication Data

US 2016/0313613 A1    Oct. 27, 2016

(30) Foreign Application Priority Data

Apr. 22, 2015    (TW) .............................. 104112927 A

(51) Int. Cl.
| | |
|---|---|
| G02F 1/1343 | (2006.01) |
| G02F 1/1368 | (2006.01) |
| G02F 1/1362 | (2006.01) |
| G02F 1/1333 | (2006.01) |
| G02F 1/1335 | (2006.01) |
| H01L 29/417 | (2006.01) |

(Continued)

(52) U.S. Cl.
CPC ....... *G02F 1/134309* (2013.01); *G02F 1/1368* (2013.01); *G02F 1/13624* (2013.01); *G02F 1/133345* (2013.01); *G02F 1/133514* (2013.01); *G02F 1/136227* (2013.01); *G02F 1/136286* (2013.01); *H01L 27/124* (2013.01); *H01L 29/41733* (2013.01); *H01L 29/42356* (2013.01); *G02F 2001/134345* (2013.01)

(58) Field of Classification Search
CPC ................. G02F 1/13624; G02F 2001/134345
See application file for complete search history.

(56) References Cited

U.S. PATENT DOCUMENTS

| | | |
|---|---|---|
| 2009/0174831 A1 | 7/2009 | Chien |
| 2010/0259699 A1 | 10/2010 | Yen |
| 2012/0023741 A1 | 2/2012 | Anthony |

(Continued)

FOREIGN PATENT DOCUMENTS

| | | |
|---|---|---|
| CN | 104483790 A | 4/2015 |
| TW | 200931146 | 7/2009 |

(Continued)

*Primary Examiner* — Phu Vu

(74) *Attorney, Agent, or Firm* — Locke Lord LLP; Tim Tingkang Xia, Esq.

(57) ABSTRACT

A pixel structure includes a gate line, a first data line, first and second pixel electrodes, first and second active devices, an insulation layer, and first and second connection electrodes. The first and second pixel electrodes are respectively disposed aside a first edge and a second edge of the gate line. The first drain electrode and second drain electrode of the first and second active devices both extend toward the second pixel electrode. The first connection electrode is electrically connected to the first drain electrode through a first contact hole and connected to the first pixel electrode; the first connection electrode and the first data line overlap in the vertical projection direction. The second connection electrode is disposed aside the second edge, and the second connection electrode is connected to the second pixel electrode and electrically connected to the second drain electrode through a second contact hole.

16 Claims, 20 Drawing Sheets

(51) Int. Cl.
 *H01L 29/423* (2006.01)
 *H01L 27/12* (2006.01)

(56) References Cited

U.S. PATENT DOCUMENTS

| | | |
|---|---|---|
| 2012/0062542 A1 | 3/2012 | Liou |
| 2012/0169956 A1 | 7/2012 | Lai |
| 2014/0035896 A1 | 2/2014 | Lin |
| 2015/0168751 A1* | 6/2015 | Lee .................. G02F 1/136227 349/41 |

FOREIGN PATENT DOCUMENTS

| | | |
|---|---|---|
| TW | 201037437 | 10/2010 |
| TW | 201211989 | 3/2012 |
| TW | 201227696 A1 | 7/2012 |
| TW | 201407592 | 2/2014 |

* cited by examiner

PIXEL STRUCTURE AND DISPLAY PANEL

BACKGROUND OF THE DISCLOSURE

1. Field of the Disclosure

The present disclosure generally relates to a pixel structure and a display panel, and more particularly, to a pixel structure and a display panel having low feed through voltage effect.

2. Description of the Related Art

Liquid crystal display panels have advantages such as compact size, lightweight and energy-saving, and therefore have been widely used in many electronic products such as smart phones, notebook computers and tablet PCs. A pixel structure of a conventional liquid crystal display panel includes gate lines, data lines, common lines, active devices, pixel electrodes, common electrodes and other components. The gate electrode of the active device is connected to the gate line, the source electrode of the active device is connected to the data line, and the drain electrode of the active device is connected to the pixel electrode. When the liquid crystal display panel is displaying, the gate electrode of the active device is actuated by the signal provided by the gate line. At the same time, the signal provided by the data line is delivered to the pixel electrode through the source electrode and drain electrode in sequence to form the pixel voltage. As a result, the liquid crystal capacitance is formed in the liquid crystal layer disposed between the pixel electrode and the common electrode. In addition, the storage capacitance is formed between the pixel electrode and the common line for maintaining the liquid crystal capacitance. What's more, other parasitic capacitances such as the gate to source capacitance ($C_{gs}$) exist in the pixel structure of the conventional liquid crystal display panel. The magnitude of the gate to source capacitance ($C_{gs}$) will affect the charging characteristic of the pixel structure, and further affect the displaying quality. For example, when the gate to source capacitance ($C_{gs}$) is too large, the pixel voltage of the pixel electrode will be lowered because of the feed through voltage effect, the grey level of the liquid crystal display panel will be further affected, and the flicker phenomenon will also appear.

SUMMARY OF THE DISCLOSURE

It is one of the objectives of the present disclosure to provide a pixel structure and a display panel having a low gate to source capacitance (Cgs).

In an embodiment of the present disclosure, a pixel structure is provided. The pixel structure includes a first substrate, a gate line, a first data line, a first pixel electrode, a second pixel electrode, a first active device, a second active device, at least one insulating layer, a first connection electrode and a second connection electrode. The gate line is disposed on the first substrate, wherein the gate line has a first edge and a second edge. The first data line is disposed on the first substrate, wherein the first data line intersects the gate line. The first pixel electrode is disposed aside the first edge of the gate line, and the second pixel electrode is disposed aside the second edge of the gate line. The first active device is disposed on the first substrate, wherein the first active device includes a first gate electrode, a first semiconductor layer, a first gate insulating layer, a first source electrode and a first drain electrode. The first gate electrode is connected to the gate line. The first semiconductor layer is disposed corresponding to the first gate electrode, wherein the first semiconductor layer overlaps at least a portion of the first gate electrode in a vertical projection direction. The first gate insulating layer is disposed between the first gate electrode and the first semiconductor layer, and the first source electrode and the first drain electrode are respectively disposed at two sides of the first semiconductor layer, wherein the first source electrode is connected to the first data line, and the first drain electrode extends toward the second pixel electrode. The second active device is disposed on the first substrate, wherein the second active device includes a second gate electrode, a second semiconductor layer, a second gate insulating layer, a second source electrode and a second drain electrode. The second gate electrode is connected to the gate line. The second semiconductor layer is disposed corresponding to the second gate electrode, wherein the second semiconductor layer overlaps at least a portion of the second gate electrode in the vertical projection direction. The second gate insulating layer is disposed between the second gate electrode and the second semiconductor layer, and the second source electrode and the second drain electrode are respectively disposed at two sides of the second semiconductor layer, wherein the second drain electrode extends toward the second pixel electrode. The at least one insulating layer covers the first active device and the second active device, wherein the at least one insulating layer has a first contact hole and a second contact hole. The first contact hole exposes the first drain electrode and the second contact hole exposes the second drain electrode. The first connection electrode has a first end and a second end, wherein the first end of the first connection electrode is electrically connected to the first drain electrode through the first contact hole, the second end of the first connection electrode is electrically connected to the first pixel electrode, the first connection electrode is disposed on the insulating layer, and the first connection electrode overlaps the first data line in the vertical projection direction. The second connection electrode is disposed aside the second edge of the gate line, wherein the second connection electrode is electrically connected to the second pixel electrode, and the second connection electrode is electrically connected to the second drain electrode through the second contact hole.

In another embodiment of the present disclosure, a display panel is provided. The display panel includes a plurality of aforementioned pixel structures, a second substrate and a display medium layer. The second substrate is disposed opposite to the first substrate, and the display medium layer is disposed between the first substrate and the second substrate.

These and other objectives of the present disclosure will no doubt become obvious to those of ordinary skill in the art after reading the following detailed description of the preferred embodiment that is illustrated in the various figures and drawings.

DETAILED DESCRIPTION

To provide a better understanding of the present disclosure to the skilled users in the technology of the present disclosure, preferred embodiments will be detailed as follows. The preferred embodiments of the present disclosure are illustrated in the accompanying drawings with numbered elements to elaborate the contents and effects to be achieved.

Figure 1:
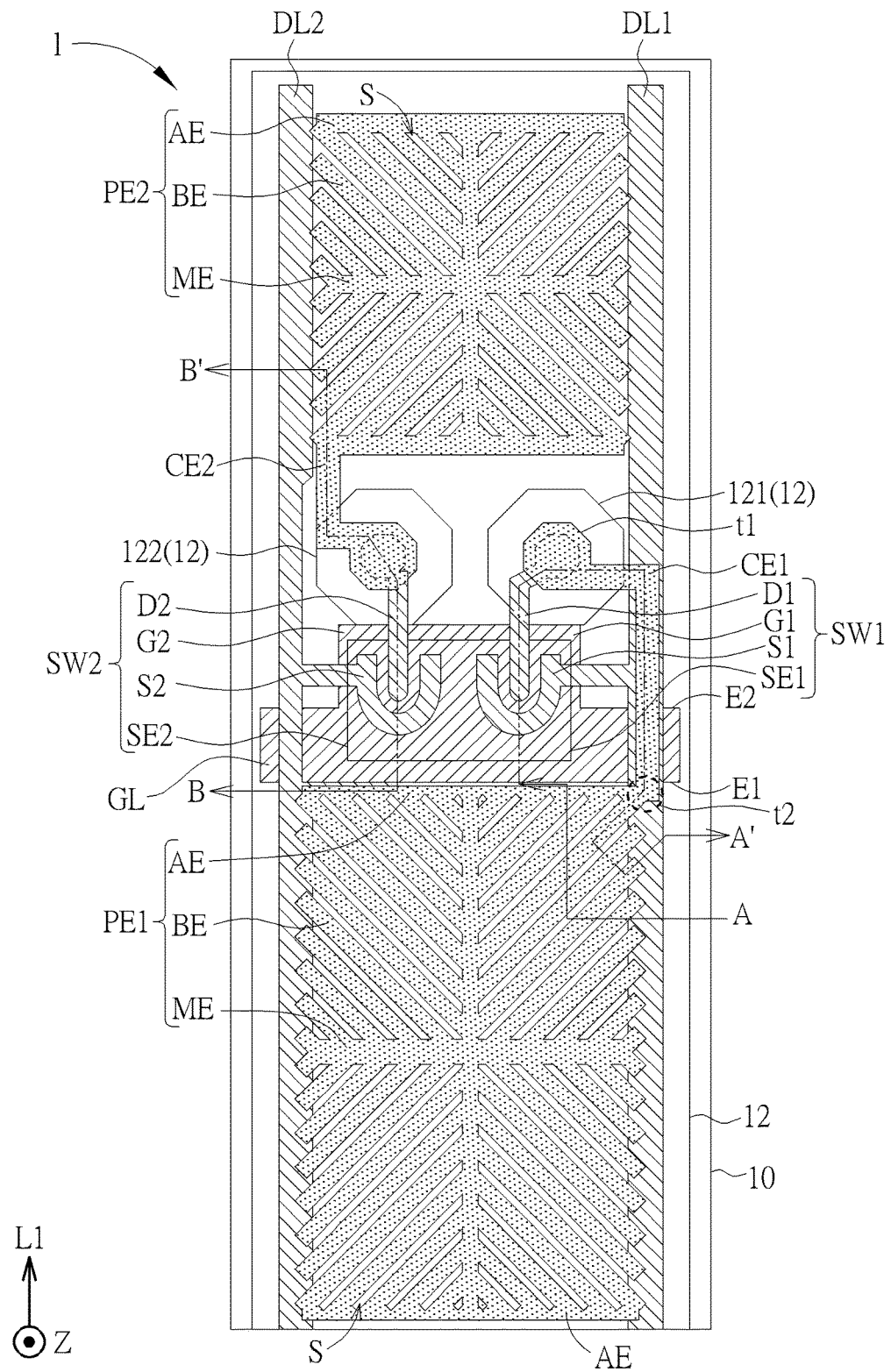
FIG. 1 is a schematic diagram illustrating a top view of a pixel structure according to a first embodiment of the present disclosure.
Figure 2:
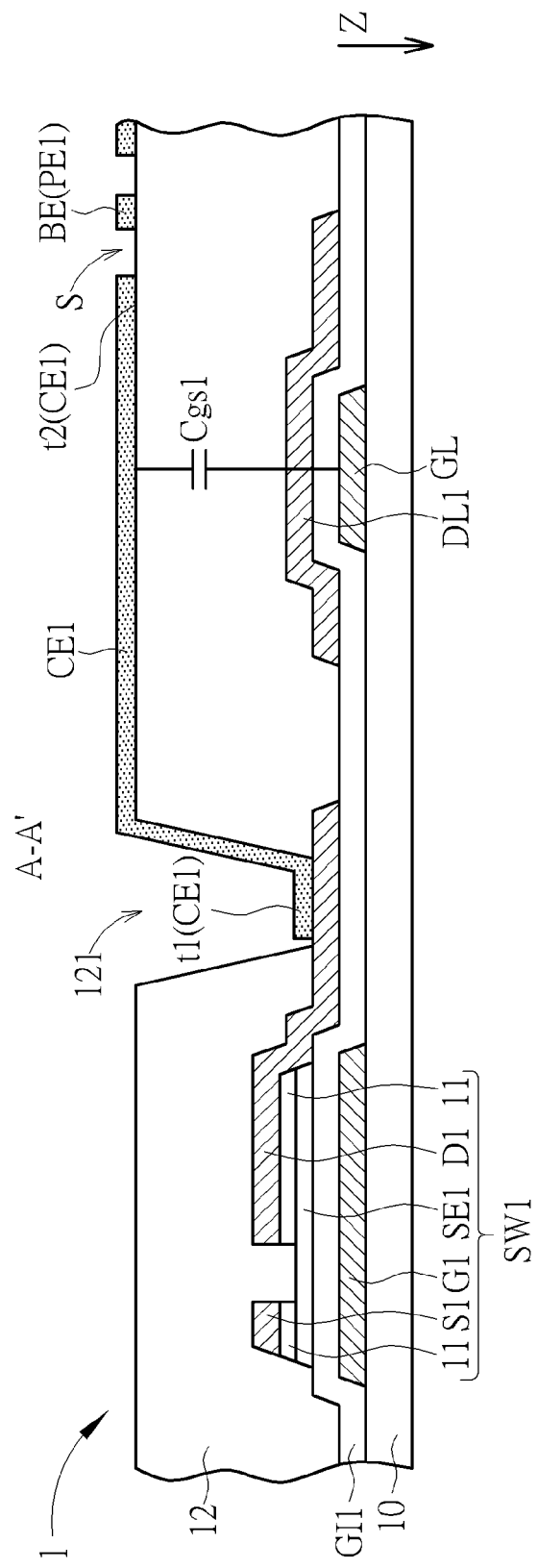
FIG. 2 is a schematic diagram illustrating a cross-sectional view of the pixel structure taken along a line A-A' in FIG. 1.
Figure 3:
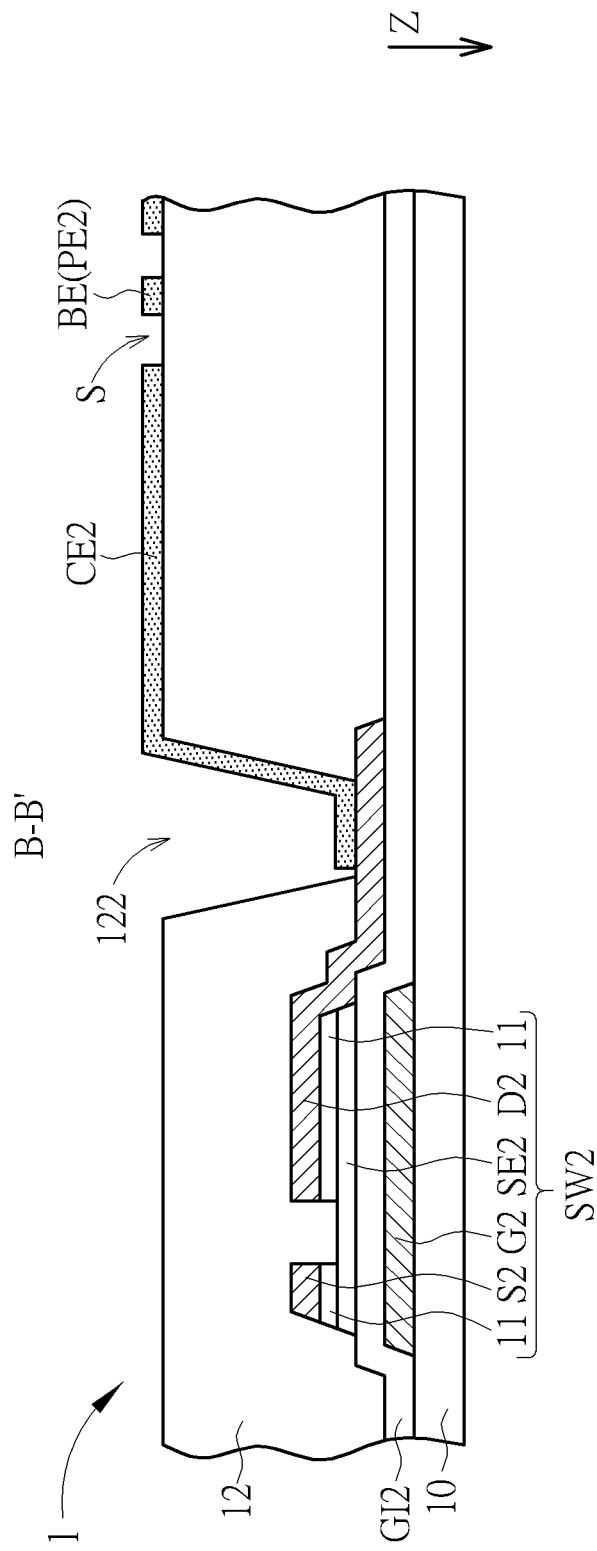
FIG. 3 is a schematic diagram illustrating a cross-sectional view of the pixel structure taken along a line B-B' in FIG. 1.
Figure 4:
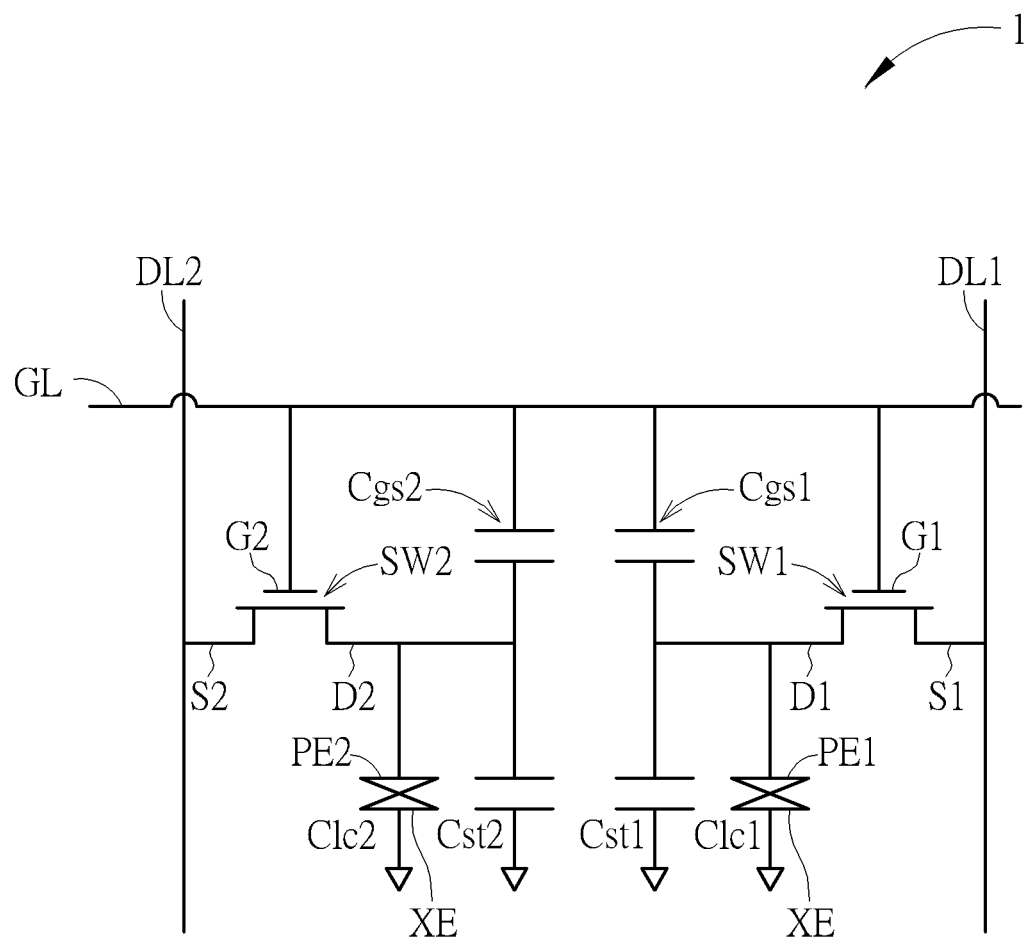
FIG. 4 is a schematic diagram illustrating an equivalent circuit of the pixel structure according to the first embodiment of the present disclosure.

Please refer to FIGS. 1-4. FIG. 1 is a schematic diagram illustrating a top view of a pixel structure according to a first embodiment of the present disclosure, FIG. 2 is a schematic diagram illustrating a cross-sectional view of the pixel structure taken along a line A-A' in FIG. 1, FIG. 3 is a schematic diagram illustrating a cross-sectional view of the pixel structure taken along a line B-B' in FIG. 1, and FIG. 4 is a schematic diagram illustrating an equivalent circuit of the pixel structure according to the first embodiment of the present disclosure. As shown in FIGS. 1-4, a pixel structure 1 of this embodiment includes a first substrate 10, a gate line GL, a first data line DL1, a second data line DL2, a first pixel electrode PE1, a second pixel electrode PE2, a first active device SW1, a second active device SW2, at least one insulating layer 12, a first connecting electrode CE1 and a second connecting electrode CE2. The first substrate 10 may be a hard substrate (namely a rigid substrate or a firm substrate) or a flexible substrate (namely a bendable substrate) such as a glass substrate, a quartz substrate, a sapphire substrate, a plastic substrate or other suitable substrates. The gate line GL is disposed on the first substrate 10, and the gate line GL has a first edge E1 and a second edge E2. The first edge E1 and the second edge E2 are two opposite side edges of the gate line GL. In this embodiment, the gate line GL substantially extends along a lateral direction in FIG. 1, and the first edge E1 and the second edge E2 are respectively a lower side edge and an upper side edge of the gate line GL in FIG. 1, but not limited thereto. In a variant embodiment for example, the gate line GL may substantially extend along a longitudinal direction in FIG. 1, and the first edge E1 and the second edge E2 are respectively a right side edge and a left side edge of the gate line GL in FIG. 1. The first data line DL1 and the second data line DL2 are disposed on the first substrate 10, and the gate line GL intersects the first data line DL1 and the second data line DL2 respectively. For example, the first data line DL1 and the second data line DL2 may extend along the longitudinal direction in FIG. 1, but not limited thereto.

The first pixel electrode PE1 is disposed aside the first edge E1 of the gate line GL, and the second pixel electrode PE2 is disposed aside the second edge E2 of the gate line GL. The first active device SW1 is disposed on the first substrate 10, and the first active device SW1 includes a first gate electrode G1, a first semiconductor layer SE1, a first gate insulating layer GI1, a first source electrode S1 and a first drain electrode D1. The first gate electrode G1 is connected to the gate line GL. The first semiconductor layer SE1 is disposed corresponding to the first gate electrode G1, and the first semiconductor layer SE1 overlaps at least a portion of the first gate electrode G1 in a vertical projection direction Z. The first gate insulating layer GI1 is disposed between the first gate electrode G1 and the first semiconductor layer SE1. The first source electrode S1 and the first drain electrode D1 are respectively disposed at two sides of the first semiconductor layer SE1, the first source electrode S1 is connected to first data line DL1, and the first drain electrode D1 extends toward the second pixel electrode PE2 from the first source electrode S1. For example, the first drain electrode D1 may extend along a first direction L1. What's more, a heavily doped semiconductor layer 11 (as shown in FIG. 2 and FIG. 3) may be disposed between the first source electrode S1 and the first semiconductor layer SE1, or between the first drain electrode D1 and the first semiconductor layer SE1. The doping concentration in the heavily doped semiconductor layer 11 is higher than the doping concentration in the first semiconductor layer SE1 to enhance ohmic contact. The second active device SW2 is disposed on the first substrate 10, and the second active device SW2 includes a second gate electrode G2, a second semiconductor layer SE2, a second gate insulating layer GI2, a second source electrode S2 and a second drain electrode D2. The second gate electrode G2 is connected to the gate line GL. The second semiconductor layer SE2 is disposed corresponding to the second gate electrode G2, and the second semiconductor layer SE2 overlaps at least a portion of the second gate electrode G2 in the vertical projection direction Z. The second gate insulating layer GI2 is disposed between the second gate electrode G2 and the second semiconductor layer SE2. The second source electrode S2 and the second drain electrode D2 are respectively disposed at two sides of the second semiconductor layer SE2. The second source electrode S2 is connected to the second data line DL2, and the second drain electrode D2 extends toward the second pixel electrode PE2 from the second source electrode S2. For example, the second drain electrode D2 may extend along the first direction L1. In this embodiment, the first drain electrode D1, the second drain electrode D2, the first data line DL1 and the second data line DL2 extend along the same direction. For example, the first drain electrode D1, the second drain electrode D2, the first data line DL1 and the second data line DL2 may extend along the first direction L1, but not limited thereto. In a variant embodiment, the first drain electrode D1 and the second drain electrode D2 may extend toward the second pixel electrode PE2, but the first drain electrode D1 and the second drain electrode D2 may extend along another direction different from the first data line DL1 and the second data line DL2, or the first drain electrode D1 and the second drain electrode D2 may respectively extend along different directions or the first drain electrode D1 and the second drain electrode D2 may further have distorted (non-straight) patterns. In addition, the heavily doped semiconductor layer 11 may selectively be disposed between the second source electrode S2 and the second semiconductor layer SE2 or between the second drain electrode D2 and the second semiconductor layer SE2 to enhance ohmic contact. Specifically, the first drain electrode D1 and the second drain electrode D2 of this embodiment protrude from the second edge E2 of the gate line GL. In another aspect, a portion of the first drain electrode D1 overlaps the first gate electrode G1 in the vertical projection direction Z, and the other portion of the first drain electrode D1 extends along the first direction L1 and does not overlap the first gate electrode G1. Furthermore, a portion of the second drain electrode D2 overlaps the second gate electrode G2 in the vertical projection direction Z, and the other portion of the second drain electrode D2 extends along the first direction L1 and does not overlap the second gate electrode G2.

The first active device SW1 and the second active device SW2 are active switching devices, such as thin film transistor devices, but not limited thereto. The first active device SW1 and the second active device SW2 are preferably simultaneously manufactured by the same process, but not limited thereto. In this embodiment, the first active device SW1 and the second active device SW2 are bottom-gate thin film transistor devices for example. The gate line GL, the first gate electrode G1 and the second gate electrode G2 may belong to the same patterned conductive layer such as a first metallic layer. The material of the gate line GL, the first gate electrode G1 or the second gate electrode G2 may be a suitable metal, a suitable alloy or a combination thereof, and the structure of the gate line GL, the first gate electrode G1 or the second gate electrode G2 may be a single-layered structure or a multi-layered stacking structure. The first gate insulating layer GI1 and the second gate insulating layer GI2 may belong to the same patterned insulating layer. The material of the first gate insulating layer GI1 or the second gate insulating layer GI2 may be an inorganic insulating material, an organic insulating material or an organic-inorganic hybrid insulating material, wherein the inorganic insulating material may be silicon oxide, silicon nitride, silicon oxynitride or a combination thereof for example. The structure of the first gate insulating layer GI1 or the second gate insulating layer GI2 may be a single-layered structure or a multi-layered stacking structure. The first semiconductor layer SE1 and the second semiconductor layer SE2 may belong to the same patterned semiconductor layer. The material of the first semiconductor layer SE1 or the second semiconductor layer SE2 may be silicon such as amorphous silicon or polycrystalline silicon. The material of the first semiconductor layer SE1 or the second semiconductor layer SE2 may also be an oxide semiconductor material such as indium gallium zinc oxide (IGZO) or other suitable semiconductor materials. The first data line DL1, the first source electrode S1, the first drain electrode D1, the second source electrode S2 and the second drain electrode D2 may belong to the same patterned conductive layer such as a second metallic layer. The material of the first data line DL1, the first source electrode S1, the first drain electrode D1, the second source electrode S2 or the second drain electrode D2 may be a suitable metal, a suitable alloy or a combination thereof, and the structure of the first data line DL1, the first source electrode S1, the first drain electrode D1, the second source electrode S2 or the second drain electrode D2 may be a single-layered structure or a multi-layered stacking structure. In a variant embodiment, the first active device SW1 and the second active device SW2 may be top-gate thin film transistor devices or any other types of thin film transistor devices. In addition, the insulating layer 12 covers the first active device SW1 and the second active device SW2, wherein the insulating layer 12 has a first contact hole 121 exposing the first drain electrode D1 and a second contact hole 122 exposing the second drain electrode D2. The insulating layer 12 preferably has a flat surface, and serves as a planarization layer so as to enhance the aperture ratio of the pixel structure 1. In this embodiment, the material of the insulating layer 12 may be an organic insulating material such as epoxy resin, acrylic or a combination thereof. What's more, the material of the insulating layer 12 may preferably be a photosensitive organic insulating material which can further be patterned by a photolithography (exposure and developing) process, but not limited thereto. In a variant embodiment, the material of the insulating layer 12 may be an organic-inorganic hybrid insulating material or an inorganic insulating material such as silicon oxide, silicon nitride, silicon oxynitride or a combination thereof. The structure of the insulating layer 12 may be a single-layered structure or a multi-layered stacking structure. In addition, the material of the insulating layer 12 of this embodiment may be a transparent insulating material, but not limited thereto. For example, the insulating layer may also be a color filter layer, but not limited thereto. In this embodiment, the first contact hole 121 and the second contact hole 122 are both disposed aside the second edge E2 of the gate line GL. Therefore, the circuit layout area along the first direction L1 may be reduced, and the aperture ratio may then be enhanced. Furthermore, the first contact hole 121 and the second contact hole 122 do not overlap the first gate electrode G1 and the second gate electrode G2 respectively, but not limited thereto. The sizes of the first contact hole 121 and the second contact hole 122 may be adjusted depending on the thickness of the insulating layer 12. For example, when the insulating layer 12 is used as the color filter layer with thicker thickness, the sizes of the first contact hole 121 and the second contact hole 122 are bigger, but not limited thereto. In another aspect, when the insulating layer 12 is used as the planarization layer with thinner thickness, the sizes of the first contact hole 121 and the second contact hole 122 are smaller, but not limited thereto.

The first pixel electrode PE1 is disposed on the insulating layer 12 and disposed aside the first edge E1 of the first gate electrode G1. The first connecting electrode CE1 has a first end t1 and a second end t2, wherein the first end t1 of the first connecting electrode CE1 is electrically connected to the first drain electrode D1 through the first contact hole 121, and the second end t2 of the first connecting electrode CE1 is electrically connected to the first pixel electrode PE1. The first connecting electrode CE1 is disposed on the insulating layer 12 and the first connecting electrode CE1 overlaps the first data line DL1 in the vertical projection direction Z. Specifically, the first connecting electrode CE1, the first data line DL1 and the gate line GL overlap one another in the vertical projection direction Z, and the first connecting electrode CE1 does not individually overlap the gate line GL in the vertical projection direction Z. Therefore, the first data line DL1 may be used as a screening electrode for shielding the electric field between the first connecting electrode CE1 and the gate line GL. In addition, the second end t2 of the first connecting electrode CE of this embodiment is connected to a corner part of the first pixel electrode PE1, and the corner part of the first pixel electrode PE1 is located adjoining to the first data line DL1 and the first edge E1 of the gate line GL. For example, the corner part is located at the upper right corner of the first pixel electrode PE1, but not limited thereto. The second pixel electrode PE2 is disposed on the insulating layer 12 and disposed aside the second edge E2 of the gate line GL. The second connecting electrode CE2 is disposed on the insulating layer 12 and disposed aside the second edge E2 of the gate line GL, wherein the second connecting electrode CE2 is electrically connected to the second pixel electrode PE2, and the second connecting electrode CE2 is electrically connected to the second drain electrode D2 through the second contact hole 122. In this embodiment, the first connecting electrode CE1 and the second connecting electrode CE2 belong to a patterned conductive layer, and the first drain electrode D1 and the second drain electrode D2 belong to another patterned conductive layer different from that of the first connection electrode CE1 and the second connection electrode CE2. For example, the first connecting electrode CE1 and the second connecting electrode CE2 may be the same patterned conductive layer such as a transparent patterned conductive layer or a non-transparent patterned conductive layer. The material of the transparent patterned conductive layer may be indium tin oxide (ITO), indium zinc oxide (IZO) or other suitable transparent conductive materials. The material of the non-transparent patterned conductive layer may be metal, alloy or other suitable non-transparent conductive materials. The first drain electrode D1 and the second drain electrode D2 may be another patterned conductive layer such as the non-transparent conductive material. The material of the non-transparent conductive material may be metal, alloy or other suitable non-transparent conductive materials. What's more, the first connecting electrode CE1, the second connecting electrode CE2, the first pixel electrode PE1 and the second pixel electrode PE2 may be the same patterned conductive layer. Therefore, the first connecting electrode CE1, the second connecting electrode CE2, the first pixel electrode PE1 and the second pixel electrode PE2 may be formed in the same patterning process, but not limited thereto.

In this embodiment, the first pixel electrode PE1 and the second pixel electrode PE2 are both patterned electrodes. The first pixel electrode PE1 and the second pixel electrode PE2 respectively include at least one main electrode ME and a plurality of branch electrodes BE. An end of each of the branch electrodes BE is connected to the main electrode ME, and a slit S exists between two adjoining branch electrodes BE. For example, the main electrode ME may be a cross-shaped electrode. The branch electrodes BE may extend along different directions. For example, the branch electrodes BE may extend along four directions. In addition, the branch electrodes BE may also extend along the same direction or along two different directions or along three different directions or along even more different directions. The sizes of the first pixel electrode PE1 and the second pixel electrode PE2 may be the same or different. For example, the size of the first pixel electrode PE1 is larger than the size of the second pixel electrode PE2 in this embodiment, but not limited thereto. In this embodiment, the branch electrodes BE of the first pixel electrode PE1 and the second pixel electrode PE2 may extend to the first data line DL1 and the second data line DL2, the branch electrodes BE of the first pixel electrode PE1 and the second pixel electrode PE2 may be above the first data line DL1 and the second data line DL2, and the branch electrodes BE of the first pixel electrode PE1 and the second pixel electrode PE2 may overlap a portion of the first data line DL1 and the second data line DL2, but not limited thereto. In a variant embodiment, the branch electrodes BE may extend to the edges of the first data line DL1 and the second data line DL2 respectively. In another variant embodiment, gaps may exist between the branch electrodes BE and the first data line DL1 and between the branch electrodes BE and the second data line DL2 respectively. In addition, the first pixel electrode PE1 may selectively further include at least one auxiliary electrode AE, wherein the auxiliary electrode AE may be connected to the second end t2 of the first connecting electrode CE1, and the auxiliary electrode AE is connected to the other ends of a portion of the branch electrodes BE. For example, the auxiliary electrode AE may be connected to the other ends of the branch electrodes BE which are adjoining to the first edge E1 of the gate line GL, and another auxiliary electrode AE may be connected to the other ends of the branch electrodes BE which are distant from the first edge E1 of the gate line GL. In another aspect, the first pixel electrode PE1 may include two auxiliary electrodes AE, one of the auxiliary electrodes AE is connected to the other ends of the branch electrodes BE which are adjoining to the first edge E1 of the gate line GL, and the other one of the auxiliary electrodes AE is connected to the other ends of the branch electrodes BE which are distant from the first edge E1 of the gate line GL, thus the conductivity of the first pixel electrode PE1 can be enhanced. In a variant embodiment, the auxiliary electrode AE may be connected to the other ends of the branch electrodes BE which are adjoining to the first data line DL1 and may be connected to the other ends of the branch electrodes BE which are adjoining to the second data line DL2, the auxiliary electrode AE may be connected to the other ends of the branch electrodes BE which are adjoining to the first data line DL1 or may be connected to the other ends of the branch electrodes BE which are adjoining to the second data line DL2, or the auxiliary electrode AE may be connected to the other ends of all the branch electrodes BE. What's more, the second pixel electrode PE2 may also include the auxiliary electrode AE, the function and the disposition of the auxiliary electrode AE of the second pixel electrode PE2 is similar to the auxiliary electrode AE of the first pixel electrode PE1, and will not be redundantly described here. The auxiliary electrode AE, the first pixel electrode PE1 and the second pixel electrode PE2 may be the same patterned conductive layer. In a variant embodiment, the first pixel electrode PE1 and the second pixel electrode PE2 may be a full-surfaced electrode respectively. Furthermore, the pixel structure 1 of this embodiment may further include a common line (not shown in the figures) disposed on the first substrate 10 and a common electrode XE (shown in FIG. 4). A first storage capacitance Cst1 (shown in FIG. 4) can be formed between the first pixel electrode PE1 and the common line, a second storage capacitance Cst2 (shown in FIG. 4) can be formed between the second pixel electrode PE2 and the common line, a first liquid crystal capacitance Clc1 (shown in FIG. 4) can be formed between the first pixel electrode PE1 and the common electrode XE, and a second liquid crystal capacitance Clc2 can be formed between the second pixel electrode PE2 and the common electrode XE.

In this embodiment, the second contact hole 122 and the second pixel electrode PE2 both are disposed aside the second edge E2 of the gate line GL, therefore the second connecting electrode CE2 connecting the second drain electrode D2 and the second pixel electrode PE2 does not required to extend across the gate line GL. Accordingly, there are no capacitance existed between the second connecting electrode CE2 and the gate line GL because the second connecting electrode CE2 does not overlap the gate line GL in the vertical projection direction Z, but a second gate to source capacitance Cgs2 exists between the second drain electrode D2 and the second gate electrode G2. In another aspect, despite the first contact hole 121 is disposed aside the second edge E2 of the gate line GL and the first pixel electrode PE1 is disposed aside the first edge E1 of the gate line GL, the first connecting electrode CE1 connecting the first drain electrode D1 (through the first contact hole 121) and the first pixel electrode PE1 is disposed on the first data line DL1, hence the first connecting electrode CE1 can be shielded by the first data line DL1. Specifically, the first data line DL1 disposed below the first connecting electrode CE1 can be regarded as the screening electrode between the first connecting electrode CE1 and the gate line GL, the first data line DL1 can effectively screen the electric field between the first connecting electrode CE1 and the gate line GL. In addition, a first gate to source capacitance Cgs1 exists between the first drain electrode D1 and the first gate electrode G1. The aforementioned disposition can effectively reduce the first gate to source capacitance Cgs1 and the second gate to source capacitance Cgs2 so as to reduce the feed through voltage effect, and the pixel voltage of the pixel electrode can be maintained. Therefore, the pixel structure 1 of this embodiment can provide the correct grey level and without the flicker phenomenon while displaying.

As shown in FIG. 4, the pixel structure 1 of this embodiment is a pixel structure adopting a 2D1G driving method. Specifically, the first active device SW1 and the second active device SW2 receive signals from the same gate line GL, and the first active device SW1 and the second active device SW2 are driven by the signals from the first data line DL1 and the second data line DL2 respectively. What's more, the first pixel electrode PE1 and the second pixel electrode PE2 may respectively be the pixel electrodes of different sub-pixels, or the first pixel electrode PE1 and the second pixel electrode PE2 may respectively be the pixel electrodes of the main region and the sub-region (namely the bright region and the dark region) in the same sub-pixel.

Figure 5:
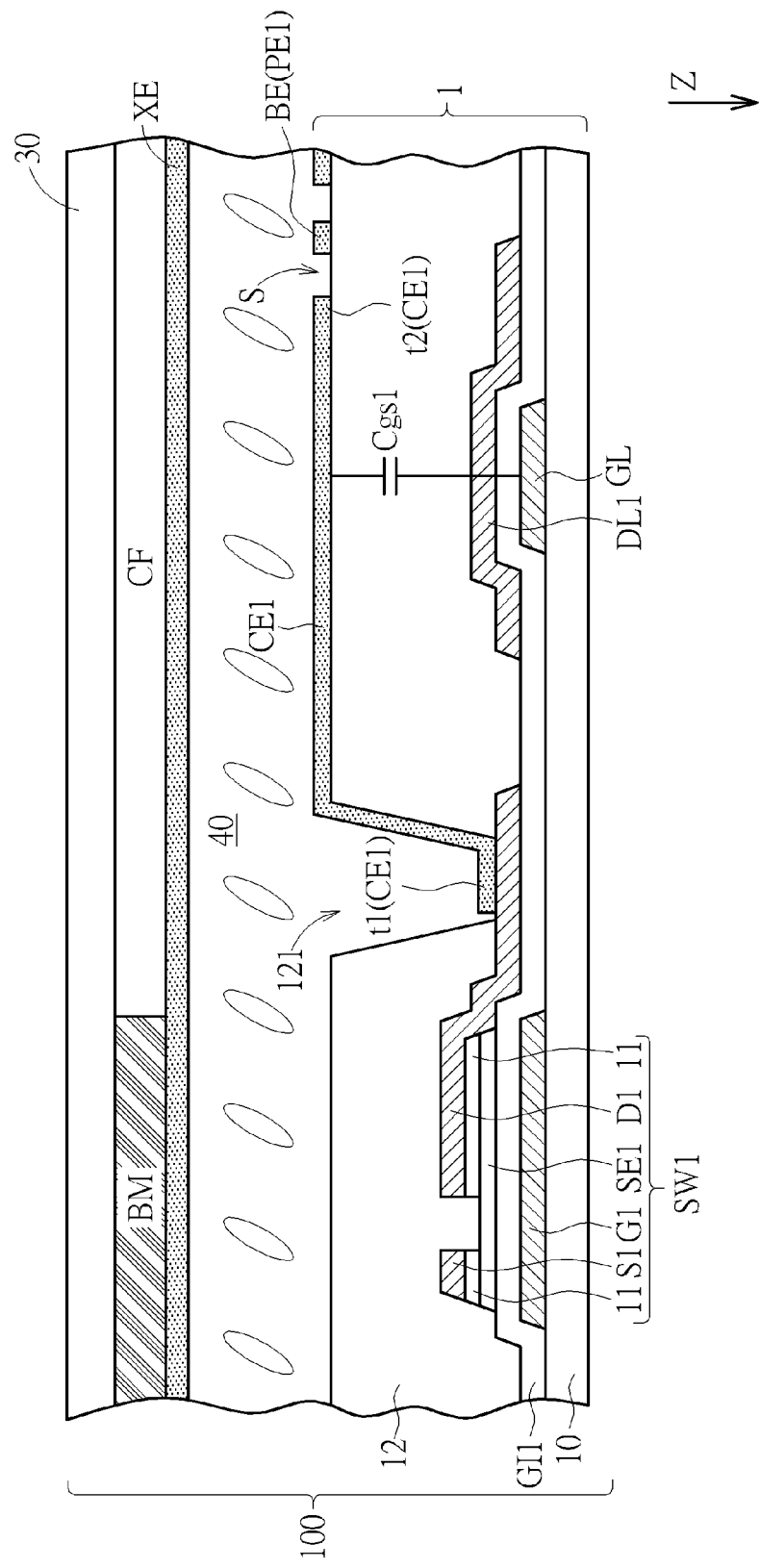
FIG. 5 is a schematic diagram illustrating a display panel according to the first embodiment of the present disclosure.

Please refer to FIG. 5, and also refer to FIGS. 1-4 together. FIG. 5 is a schematic diagram illustrating a display panel according to the first embodiment of the present disclosure. As shown in FIG. 5, a display panel 100 of this embodiment includes the pixel structure 1 of the first embodiment (or the pixel structure in other variant embodiments), a second substrate 30 and a display medium layer 40. The second substrate 30 is disposed opposite to the first substrate 10. The second substrate 30 may be a hard substrate (namely a rigid substrate or a firm substrate) or a flexible substrate (namely a bendable substrate) such as a glass substrate, a quartz substrate, a sapphire substrate, a plastic substrate or other suitable substrates. The display medium layer 40 is disposed between the first substrate 10 and the second substrate 30. The display medium layer 40 of this embodiment may be a liquid crystal layer, but not limited thereto. For example, the display medium layer 40 may also include a non-self-luminous display medium layer or a self-luminous display medium layer. The non-self-luminous display medium layer may be an electrowetting display medium layer or an electrophoretic display medium layer or other suitable non-self-luminous display medium layers. The self-luminous display medium layer may be an organic electroluminescence display medium layer, inorganic electroluminescence display medium layer, plasma display medium layer, field emission display medium layer, or other suitable self-luminous display medium layer. The common electrode XE of the display panel 100 of this embodiment may be disposed on the second substrate 30, and the display panel 100 may further include other elements such as a black matrix 32, a color filter layer CF, a spacer (not shown in the figures), an alignment film (not shown in the figures), and the function and the disposition of the above mentioned elements will not be redundantly described here. In addition, the display panel 100 of this embodiment may be a flat display panel, a curved display panel, a flexible display panel or other types of the display panels. The display panel 100 of this embodiment may further be combined with a backlight module to form a display device.

The pixel structure and the display panel of the present disclosure are not limited to the above mentioned embodiment. The following description will detail the pixel structure and the display panels of other preferable embodiments. To simplify the description, identical components in each of the following embodiments are marked with identical symbols. For making it easier to understand the differences between the embodiments, the following description will detail the dissimilarities among different embodiments and the identical features will not be redundantly described.

Figure 6:
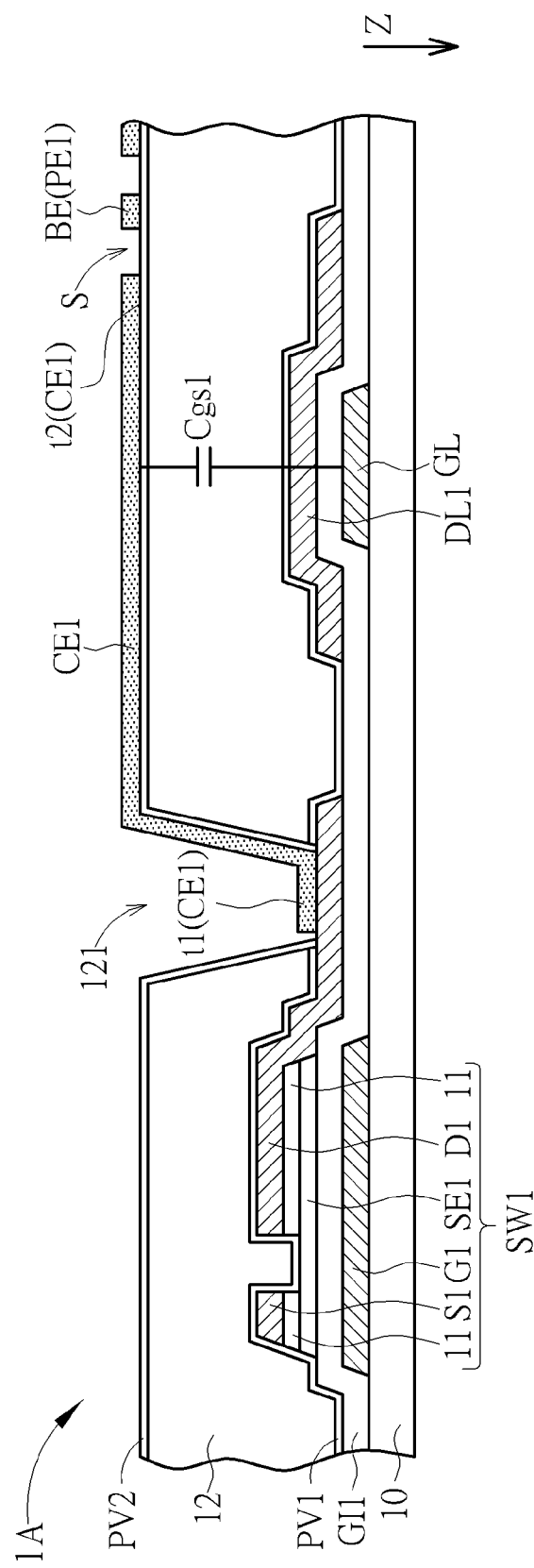
FIG. 6 and FIG. 7 are schematic diagrams illustrating cross-sectional views of a pixel structure according to a first variant embodiment of the first embodiment of the present disclosure.
Figure 7:
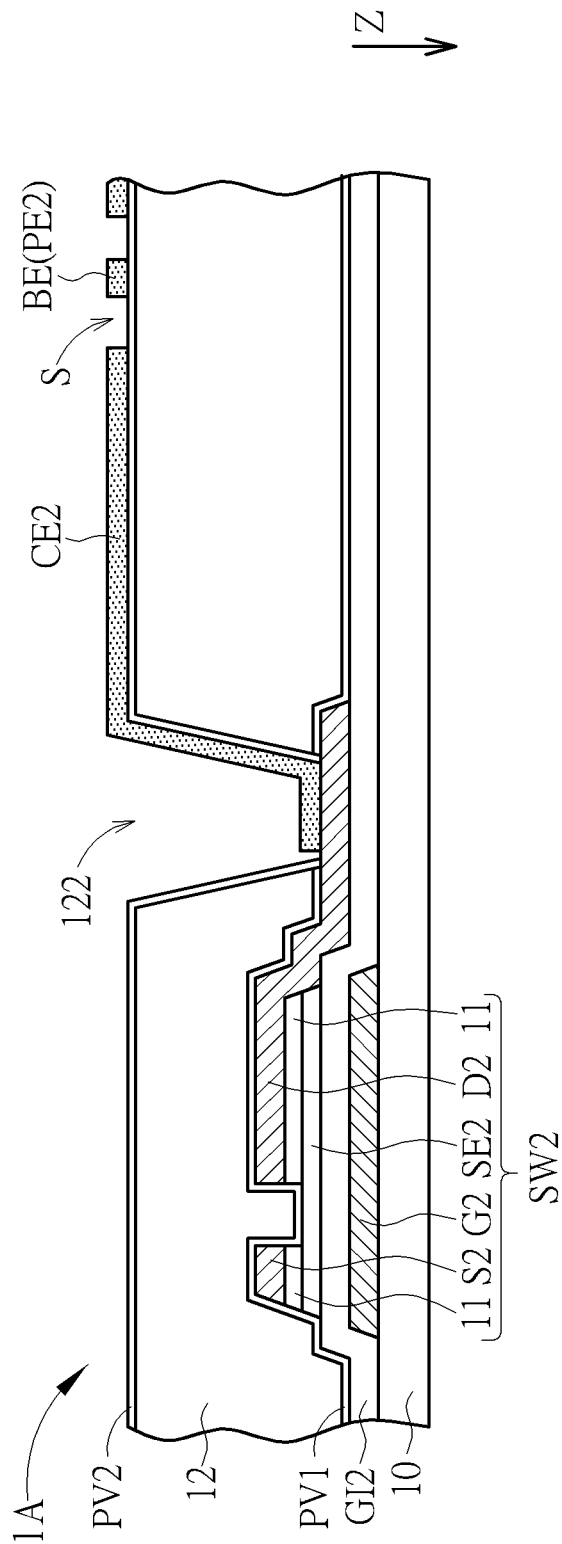

Please refer to FIG. 6 and FIG. 7, and also refer to FIGS. 1-4 together. FIG. 6 and FIG. 7 are schematic diagrams illustrating cross-sectional views of a pixel structure according to a first variant embodiment of the first embodiment of the present disclosure. As shown in FIG. 6 and FIG. 7, the insulating layer 12 in the first variant embodiment may be the color filter layer, therefore a pixel structure 1A is a color filter on array (COA) pixel structure which the color filter layer is disposed on an array substrate, but not limited thereto. In addition, the pixel structure 1A may further include at least one first dielectric film PV1 and/or at least one second dielectric film PV2. The first dielectric film PV1 is disposed between the first gate insulating layer GI1 and the insulating layer 12 and between the second gate insulating layer GI2 and the insulating layer 12. The first dielectric film PV1 covers the first active device SW1 and the second active device SW2, so as to protect the first active device SW1 and the second active device SW2. What's more, a portion of the first drain electrode D1 and the second drain electrode D2 are not covered by the first dielectric film PV1. The material of the first dielectric film PV1 may include the inorganic insulating materials such as silicon oxide, silicon nitride, silicon oxynitride or a combination thereof, therefore the adhesion between the first gate insulating layer GI1 and the insulating layer 12 and between the second gate insulating layer GI2 and the insulating layer 12 can be enhanced. The material of the first dielectric film PV1 may also be other suitable dielectric materials. The second dielectric film PV2 is disposed between the first pixel electrode PE1 and the insulating layer 12, between the first connecting electrode CE1 and the insulating layer 12, between the second pixel electrode PE2 and the insulating layer 12 and between the second connecting electrode CE2 and the insulating layer 12. The material of the second dielectric film PV2 and the material of the first dielectric film PV1 may be the same or different, and the second dielectric film PV2 can enhance the adhesion between the above mentioned films. Furthermore, the sidewalls of the first contact hole 121 of the insulating layer 12 and the sidewalls of the second contact hole 122 of the insulating layer 12 can be covered by the second dielectric film PV2, and a portion of the first drain electrode D1 and second drain electrode D2 are not covered by the second dielectric film PV2. Therefore, the first connecting electrode CE1 and the second connecting electrode CE2 can be respectively connected to the first drain electrode D1 and the second drain electrode D2.

Figure 8:
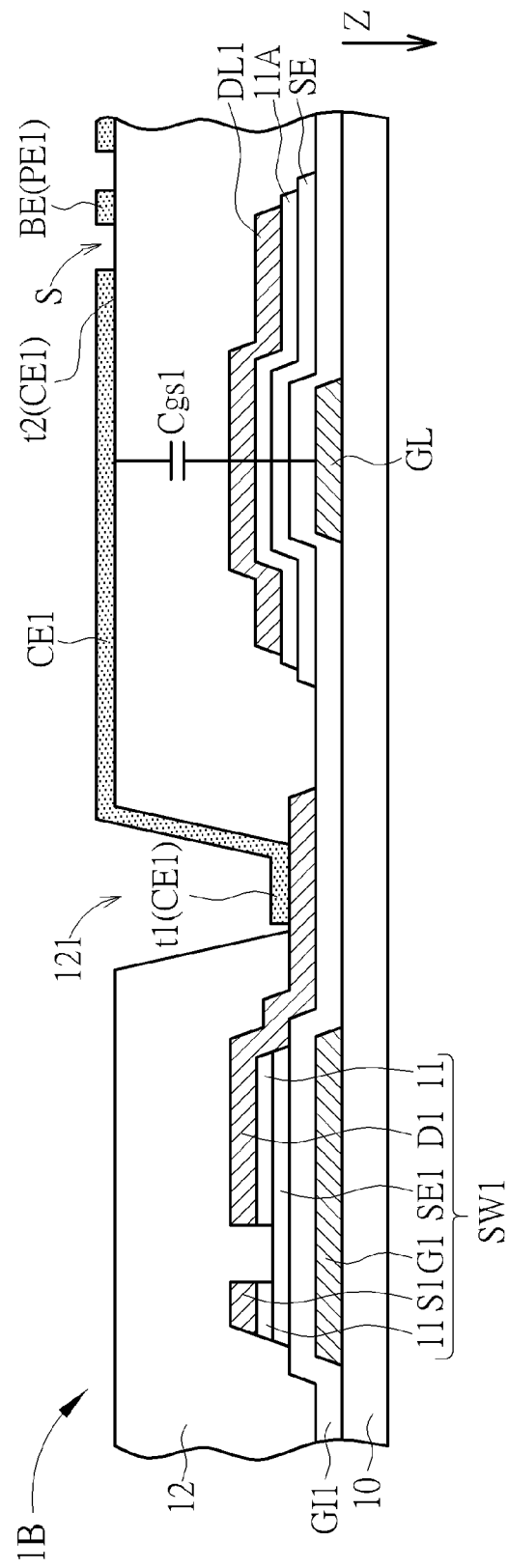
FIG. 8 and FIG. 9 are schematic diagrams illustrating cross-sectional views of a pixel structure according to a second variant embodiment of the first embodiment of the present disclosure.
Figure 9:
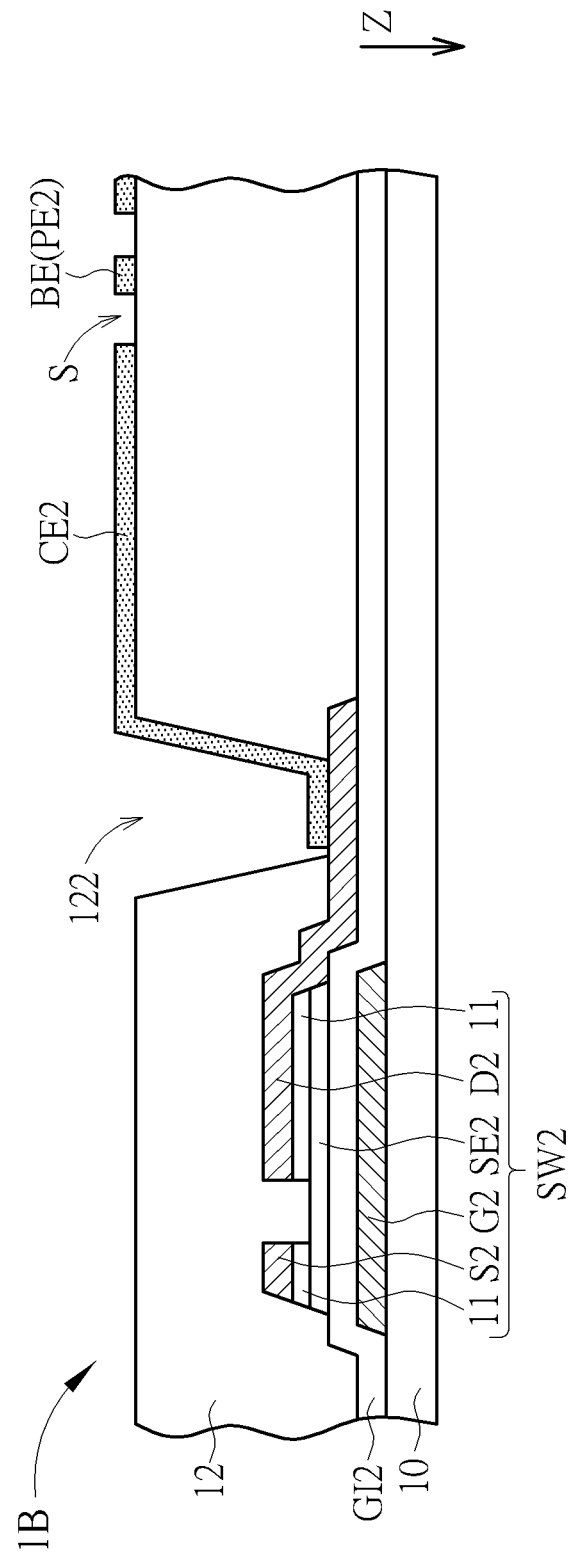

Please refer to FIG. 8 and FIG. 9, and also refer to FIGS. 1-4 together. FIG. 8 and FIG. 9 are schematic diagrams illustrating cross-sectional views of a pixel structure according to a second variant embodiment of the first embodiment of the present disclosure. As shown in FIG. 8 and FIG. 9, the pixel structure 1B of the second variant embodiment can further include a semiconductor pattern SE and/or a heavily doped semiconductor pattern 11A, the semiconductor pattern SE and the heavily doped semiconductor pattern 11A are disposed between the first data line DL1 and the first gate insulating layer GI1, and the first connecting electrode CE1 overlaps the gate line GL, the first data line DL1, the semiconductor pattern SE and the heavily doped semiconductor pattern 11A in the vertical projection direction Z. In another aspect, the semiconductor pattern SE and the heavily doped semiconductor pattern 11A are disposed between the second data line DL2 and the second gate insulating layer GI2, and the second connecting electrode CE2 overlaps the gate line GL, the second data line DL2, the semiconductor pattern SE and the heavily doped semiconductor pattern 11A in the vertical projection direction Z. The semiconductor pattern SE, the first semiconductor layer SE1 and the second semiconductor layer SE2 may be the same patterned semiconductor layer, but not limited thereto. The heavily doped semiconductor pattern 11A and the heavily doped semiconductor layer 11 may be the same patterned and doped semiconductor layer, but not limited thereto. The semiconductor pattern SE and/or the heavily doped semiconductor pattern 11A can further reduce the first gate to source capacitance Cgs1 between the gate line GL and the first connecting electrode CE1, and reduce the second gate to source capacitance Cgs2 between the gate line GL and the second connecting electrode CE2.

Figure 10:
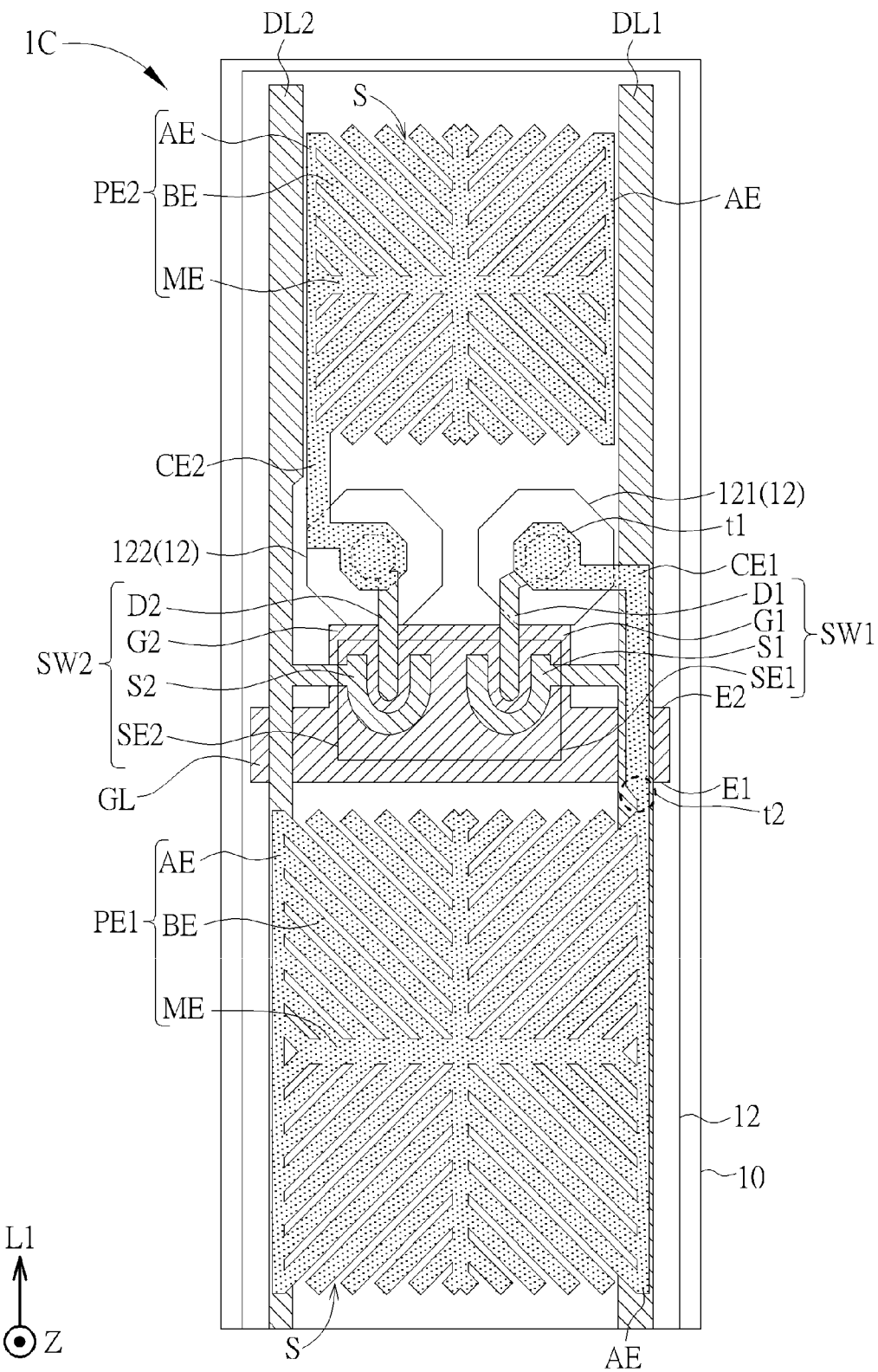
FIG. 10 is a schematic diagram illustrating a pixel structure according to a third variant embodiment of the first embodiment of the present disclosure.

Please refer to FIG. 10, and also refer to FIGS. 2-4 together. FIG. 10 is a schematic diagram illustrating a pixel structure according to a third variant embodiment of the first embodiment of the present disclosure. As shown in FIG. 10, in a pixel structure 1C of the third variant embodiment, the auxiliary electrodes AE of the first pixel electrode PE1 and the second pixel electrode PE2 are connected to the other ends of the branch electrodes BE adjoining to the first data line DL1 and/or connected to the other ends of the branch electrodes BE adjoining to the second data line DL2.

Figure 11:
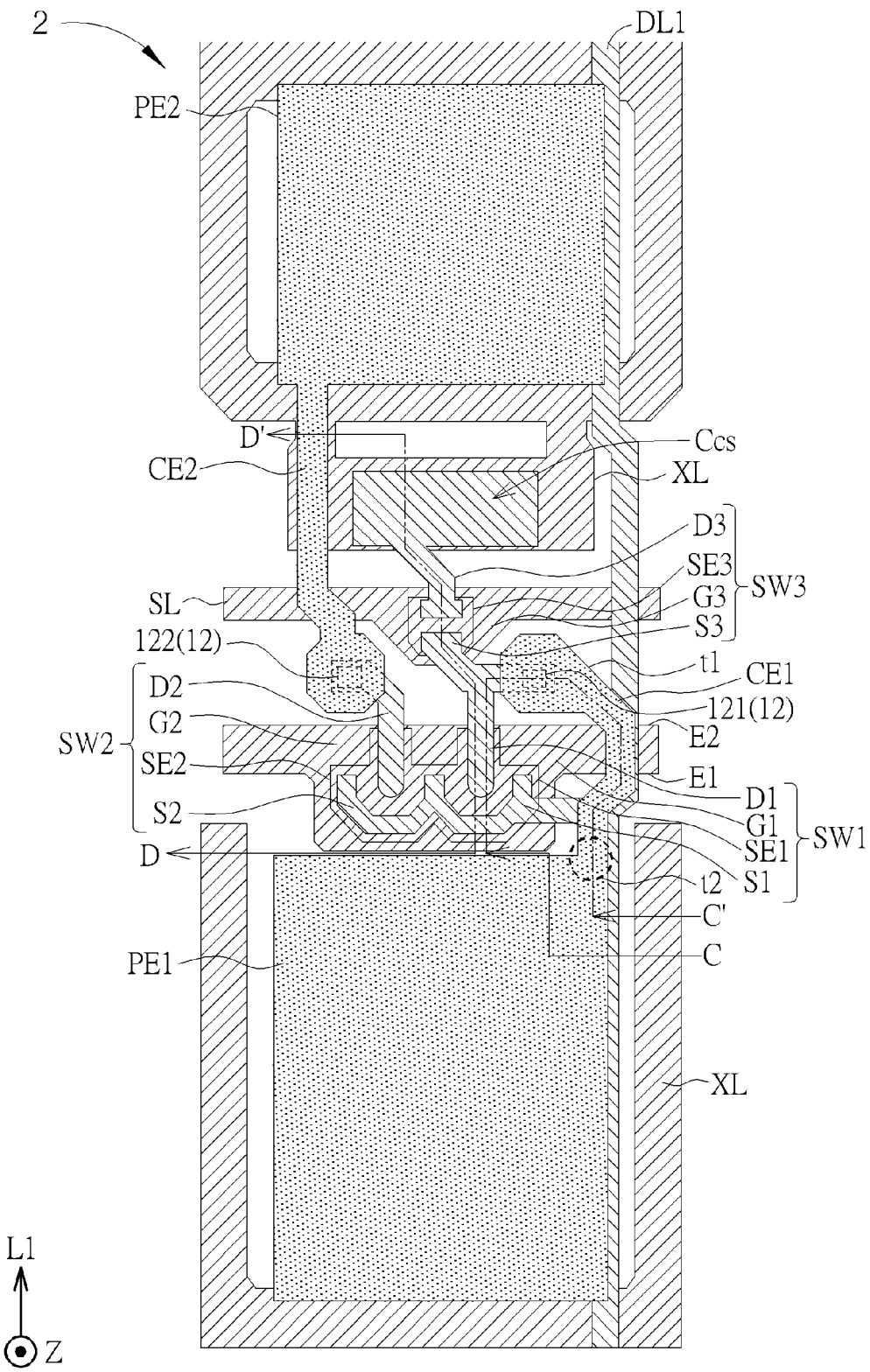
FIG. 11 is a schematic diagram illustrating a top view of a pixel structure according to a second embodiment of the present disclosure.
Figure 12:
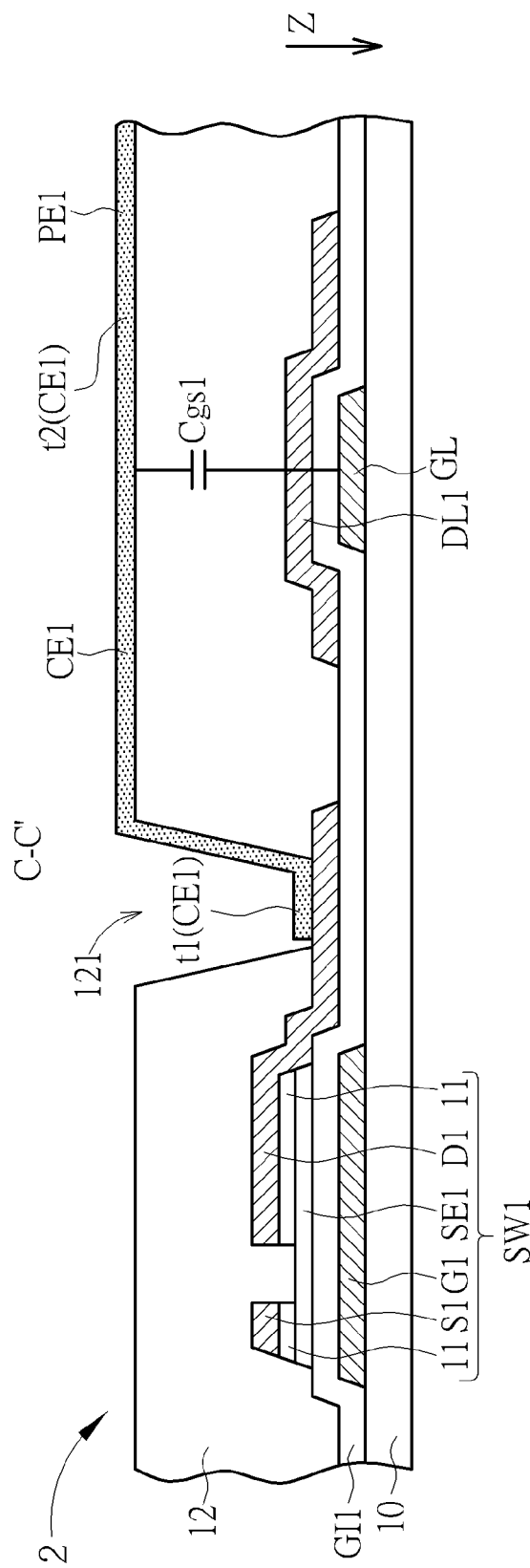
FIG. 12 is a schematic diagram illustrating a cross-sectional view of the pixel structure taken along a line C-C' in FIG. 11.
Figure 13:
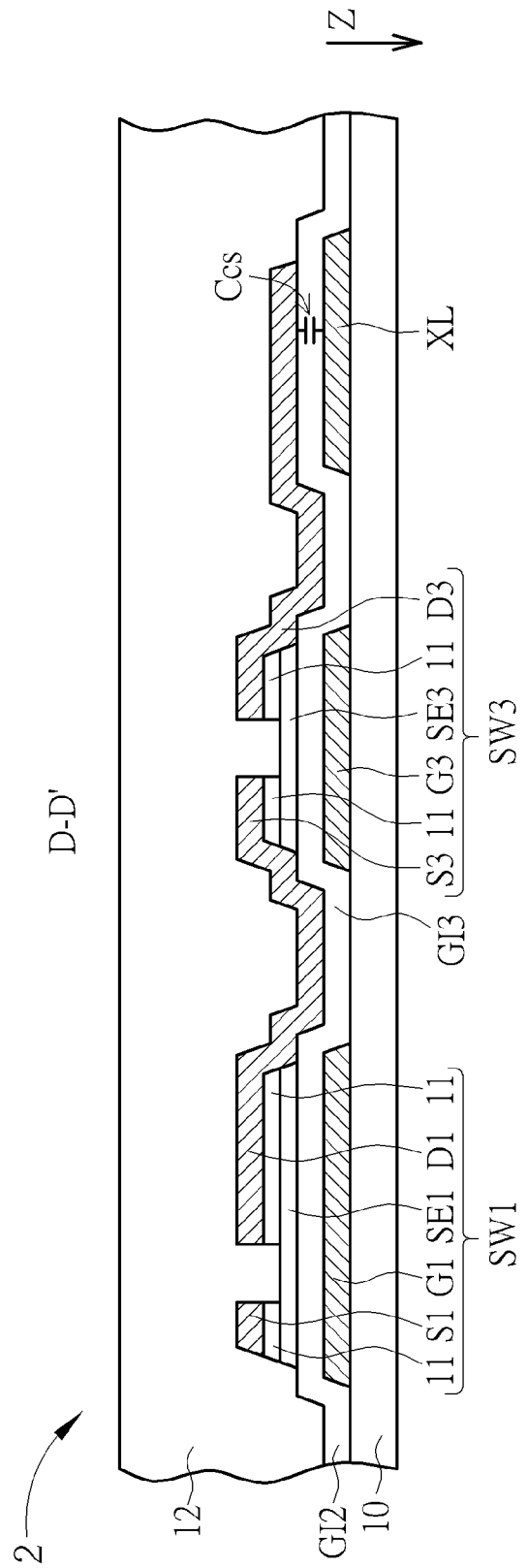
FIG. 13 is a schematic diagram illustrating a cross-sectional view of the pixel structure taken along a line D-D' in FIG. 11.
Figure 14:
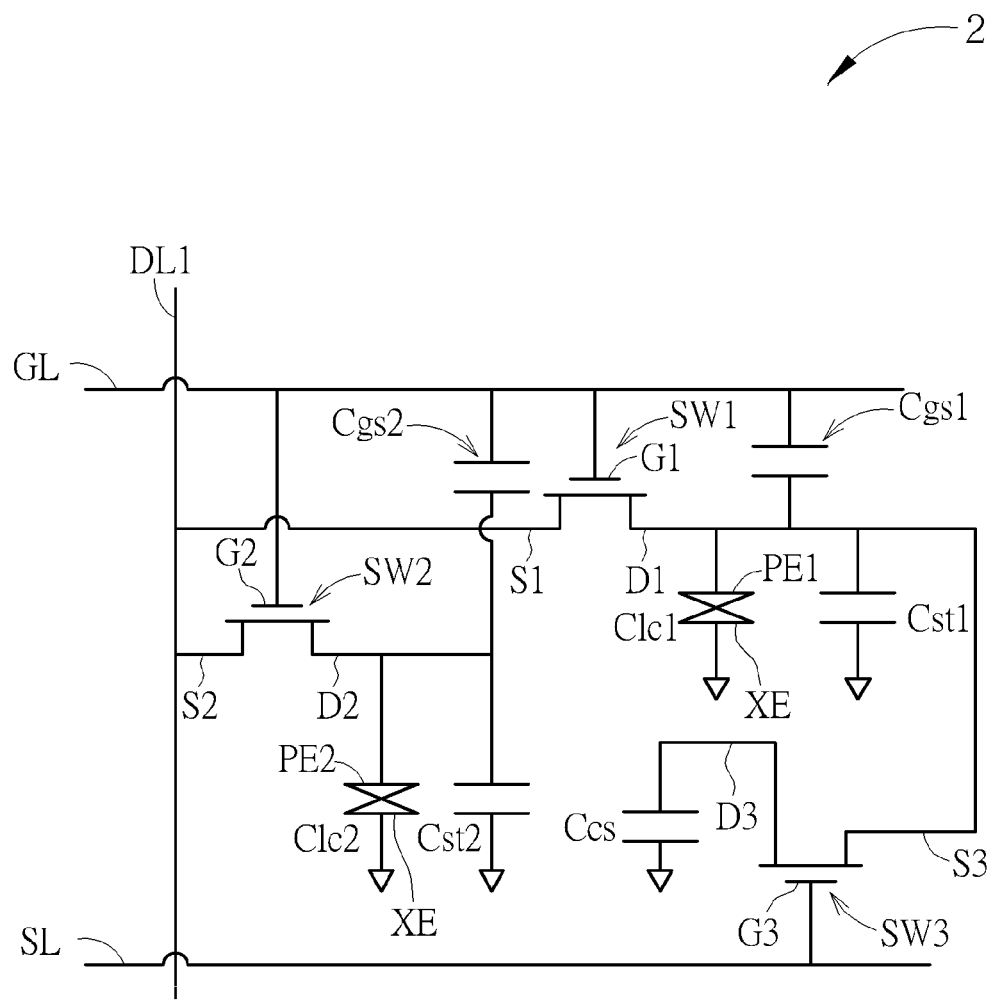
FIG. 14 is a schematic diagram illustrating an equivalent circuit of the pixel structure according to the second embodiment of the present disclosure.

Please refer to FIGS. 11-14. FIG. 11 is a schematic diagram illustrating a top view of a pixel structure according to a second embodiment of the present disclosure, FIG. 12 is a schematic diagram illustrating a cross-sectional view of the pixel structure taken along a line C-C' in FIG. 11, FIG. 13 is a schematic diagram illustrating a cross-sectional view of the pixel structure taken along a line D-D' in FIG. 11, and FIG. 14 is a schematic diagram illustrating an equivalent circuit of the pixel structure according to the second embodiment of the present disclosure. As shown in FIGS. 11-14, the difference between this embodiment and the first embodiment is that a pixel structure 2 of this embodiment is a pixel structure adopting a 1D1G driving method. Specifically, the first active device SW1 and the second active device SW2 are driven by the same gate line GL and the same first data line DL1, and the second source electrode S2 of the second active device SW2 is electrically connected to the first source electrode S1 of the first active device SW1. In addition, the pixel structure 2 of this embodiment further includes a signal line SL, a common line XL and a third active device SW3. The signal line SL is disposed on the first substrate 10 and between the gate line GL and the second pixel electrode PE2. The common line XL is disposed on the first substrate 10 and between the signal line SL and the second pixel electrode PE2, and the common line XL can further disposed aside at least one edge of the first pixel electrode PE1 and at least one edge of the second pixel electrode PE2. For example, the common line XL of this embodiment is disposed aside three edges of the first pixel electrode PE1 and surround the second pixel electrode PE2, but not limited thereto. The shape of the common line XL may be an I-shape, a H-shape or other different shapes. In addition, the first pixel electrode PE1 overlaps a portion of the common line XL in the vertical projection direction Z, and a first storage capacitance Cst1 is formed between the first pixel electrode PE1 and the common line XL. The second pixel electrode PE2 overlaps the common line XL in the vertical projection direction Z, and a second storage capacitance Cst2 is formed between the second pixel electrode PE2 and the common line XL. The third active device SW3 is disposed on the first substrate 10, and the third active device SW3 includes a third gate electrode G3, a third semiconductor layer SE3, a third gate electrode insulating layer GI3, a third source electrode S3 and a third drain electrode D3. The third gate electrode G3 is connected to the signal line SL. The third semiconductor layer SE3 is disposed corresponding to the third gate electrode G3, and the third semiconductor layer SE3 overlaps a portion of the third gate electrode G3 in the vertical projection direction Z. The third gate electrode insulating layer GI3 is disposed between the third gate electrode G3 and the third semiconductor layer SE3. The third source electrode S3 and the third drain electrode D3 is disposed respectively at two sides of the third semiconductor layer SE3, wherein the third source electrode S3 is electrically connected to the first drain electrode D1, and the third drain electrode D3 overlaps a portion of the common line XL in the vertical projection direction Z. The signal line SL, the common line XL and the third gate electrode G3 may belong to the same patterned conductive layer of the gate line GL, the first gate electrode G1 and the second gate electrode G2. The third gate electrode insulating layer GI3, the first gate insulating layer GI1 and the second gate insulating layer GI2 may be the same patterned insulating layer. The third semiconductor layer SE3, the first semiconductor layer SE1 and the second semiconductor layer SE2 may be the same patterned semiconductor layer. The third source electrode S3 and the third drain electrode D3 may be the same patterned conductive layer of the first data line DL1, the first source electrode S1, the first drain electrode D1, the second source electrode S2 and the second drain electrode D2. In addition, the signal line SL, the common line XL and the gate line GL are unconnected to each other. What's more, the first pixel electrode PE1 and the second pixel electrode PE2 of this embodiment may be the full-surfaced electrode respectively, but not limited thereto. For example, the first pixel electrode PE1 and the second pixel electrode PE2 may be the patterned electrodes, and the first pixel electrode PE1 and the second pixel electrode PE2 may include the main electrodes, the branch electrodes and the slits (as shown in FIG. 1), or other suitable patterns.

In this embodiment, the third active device SW3 is used for adjusting the pixel voltage of the first pixel electrode PE1. The third source electrode S3 is electrically connected to the first drain electrode D1. The third drain electrode D3 overlaps a portion of the common line XL in the vertical projection direction Z, and an adjusting capacitance Ccs is formed between the third drain electrode D3 and the common line XL. For example, the signals from the gate line GL can turn on the first gate electrode G1 and the second gate electrode G2 while displaying, and then the first data line DL1 sends the signals to the first pixel electrode PE1 and the second pixel electrode PE2 after the first gate electrode G1 and the second gate electrode G2 are turned on. In addition, the signals from the signal line SL can turn on the third gate electrode G3 after the first gate electrode G1 and the second gate electrode G2 are turned off. At the same time, the first pixel electrode PE1 and the first drain electrode D1 can be electrically connected to the adjusting capacitance Ccs, and the pixel voltage of the first pixel electrode PE1 will be different from the second pixel electrode PE2. The pixel structure 2 of this embodiment may be the pixel structure of the first, second or third variant embodiment of the first embodiment or other variant embodiments according to different requirements.

In this embodiment, the first data line DL1 is disposed between an overlapping portion of the first connecting electrode CE1 and the gate line GL. The first data line DL1 can be regarded as the screening electrode, and the first data line DL1 can effectively screen the electric field between the first connecting electrode CE1 and the gate line GL. In addition, the second gate to source capacitance Cgs2 can also be effectively reduced, so as to reduce the feed through voltage effect, and the pixel voltage of the pixel electrode can be maintained. Therefore, the pixel structure 2 of this embodiment can provide the correct grey level and without the flicker phenomenon while displaying.

Figure 15:
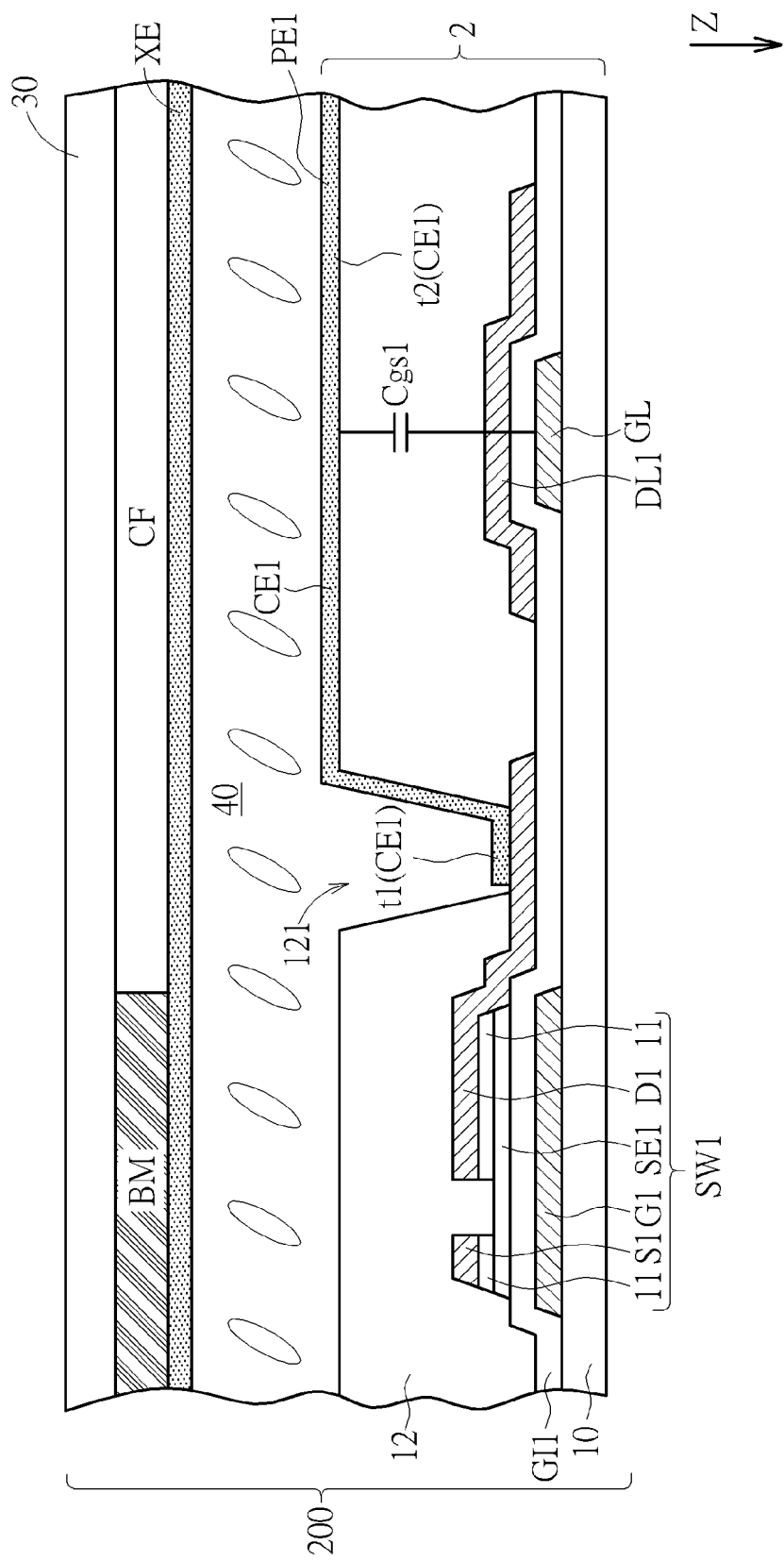
FIG. 15 is a schematic diagram illustrating a display panel according to the second embodiment of the present disclosure.

Please refer to FIG. 15, and also refer to FIGS. 11-14 together. FIG. 15 is a schematic diagram illustrating a display panel according to the second embodiment of the present disclosure. As shown in FIG. 15, a display panel 200 of this embodiment includes the pixel structure 2 of the second embodiment (or the pixel structure of the other variant embodiments), a second substrate 30 and a display medium layer 40. The second substrate 30 is disposed opposite to the first substrate 10. The second substrate 30 may be a hard substrate (namely a rigid substrate or a firm substrate) or a flexible substrate (namely a bendable substrate) such as a glass substrate, a quartz substrate, a sapphire substrate, a plastic substrate or other suitable substrates. The display medium layer 40 is disposed between the first substrate 10 and the second substrate 30. The display medium layer 40 of this embodiment may be a liquid crystal layer, but not limited thereto. For example, the display medium layer 40 may also include a non-self-luminous display medium layer or a self-luminous display medium layer. The non-self-luminous display medium layer may be an electrowetting display medium layer or an electrophoretic display medium layer or other suitable non-self-luminous display medium layers. The self-luminous display medium layer may be an organic electroluminescence display medium layer, inorganic electroluminescence display medium layer, plasma display medium layer, field emission display medium layer, or other suitable self-luminous display medium layer. The common electrode XE of the display panel 200 of this embodiment may be disposed on the second substrate 30, and the display panel 200 may further include other elements such as a black matrix 32, a color filter layer CF, a spacer (not shown in the figures), an alignment film (not shown in the figures), and the function and the disposition of the above mentioned elements will not be redundantly described here. In addition, the display panel 200 of this embodiment may be a flat display panel, a curved display panel, a flexible display panel or other types of the display panels. The display panel 200 of this embodiment may further be combined with a backlight module to form a display device.

Figure 16:
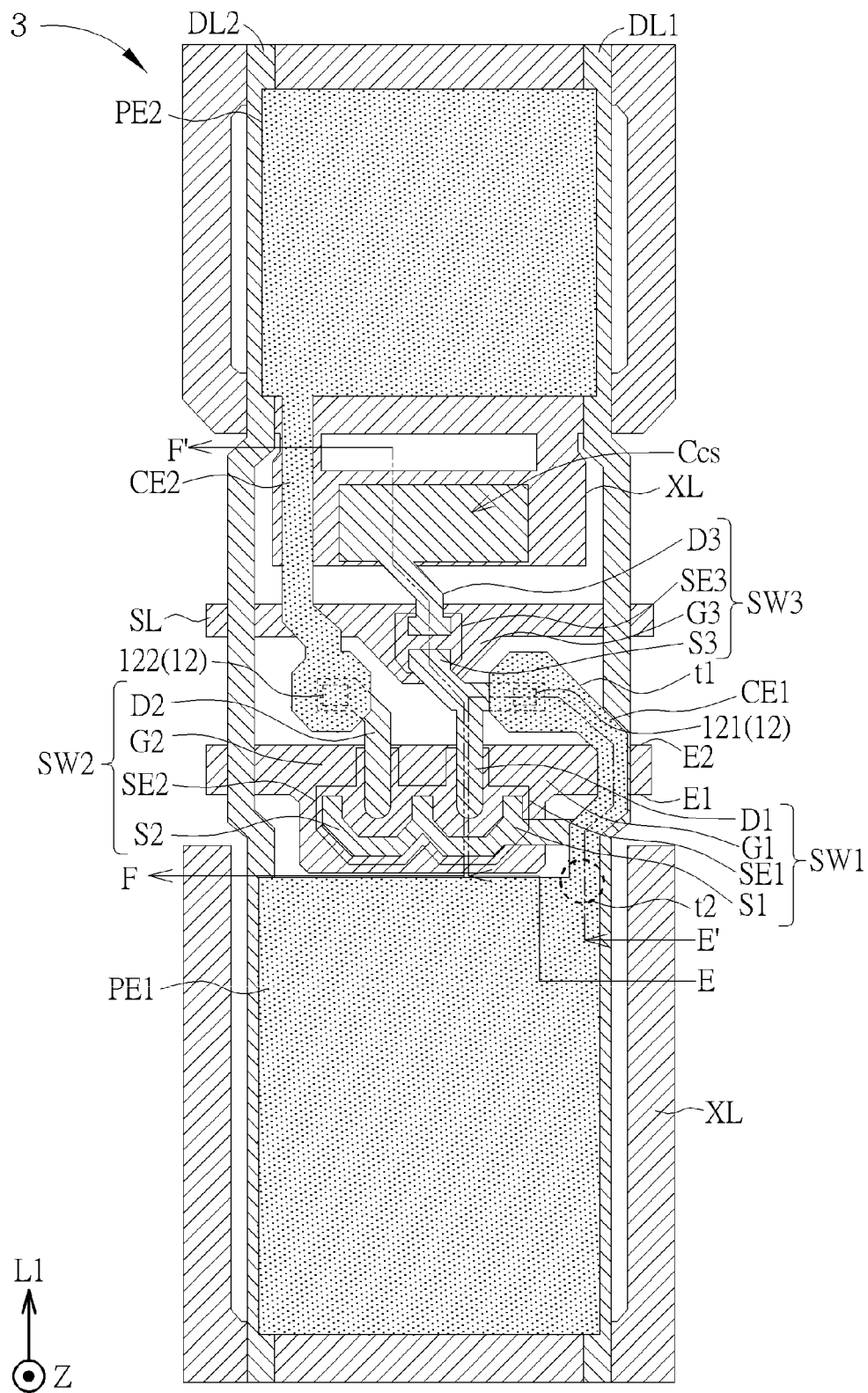
FIG. 16 is a schematic diagram illustrating a top view of a pixel structure according to a third embodiment of the present disclosure.
Figure 17:
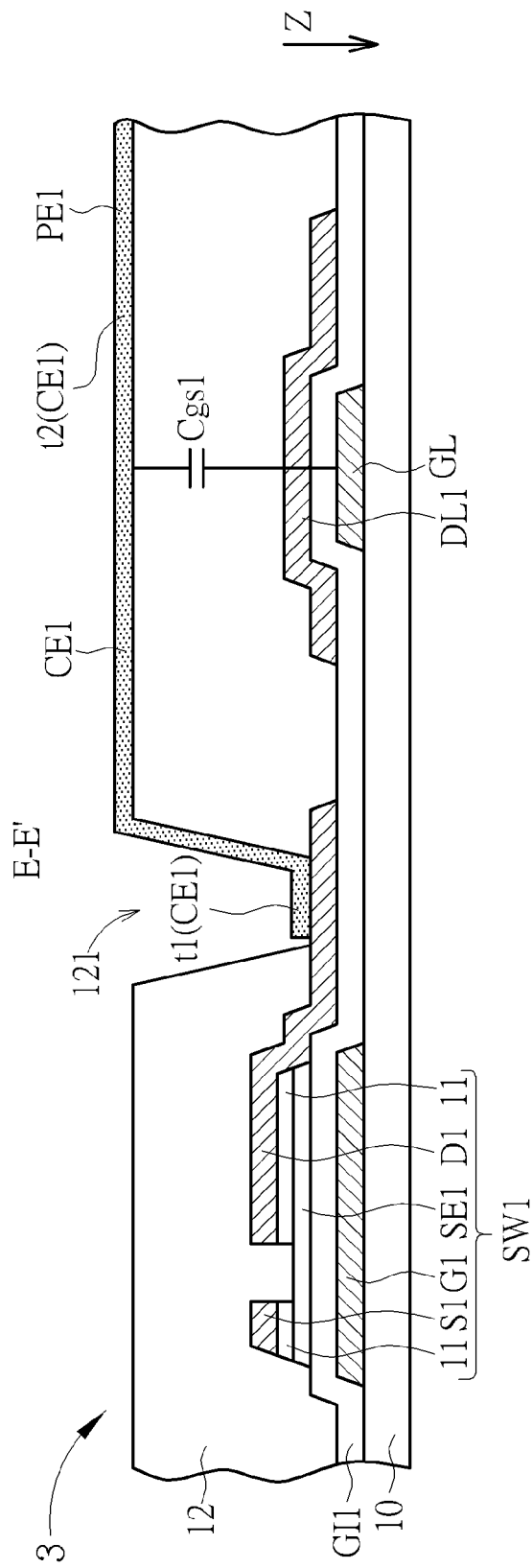
FIG. 17 is a schematic diagram illustrating a cross-sectional view of the pixel structure taken along a line E-E' in FIG. 16.
Figure 18:
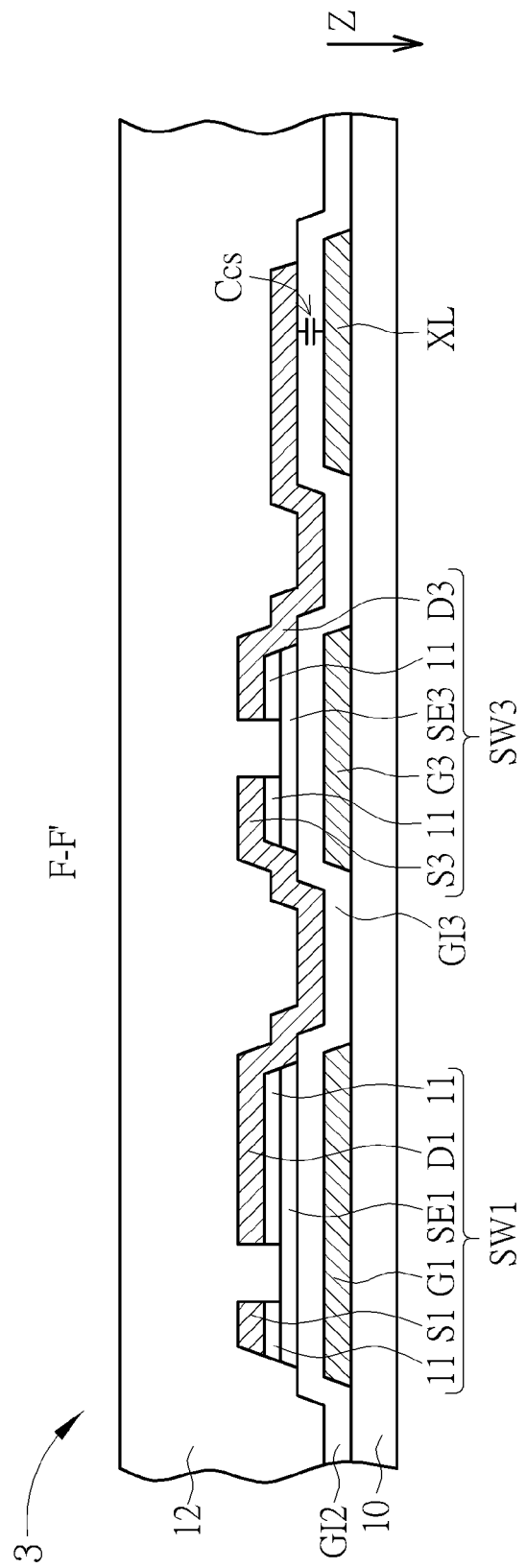
FIG. 18 is a schematic diagram illustrating a cross-sectional view of the pixel structure taken along a line F-F' in FIG. 16.
Figure 19:
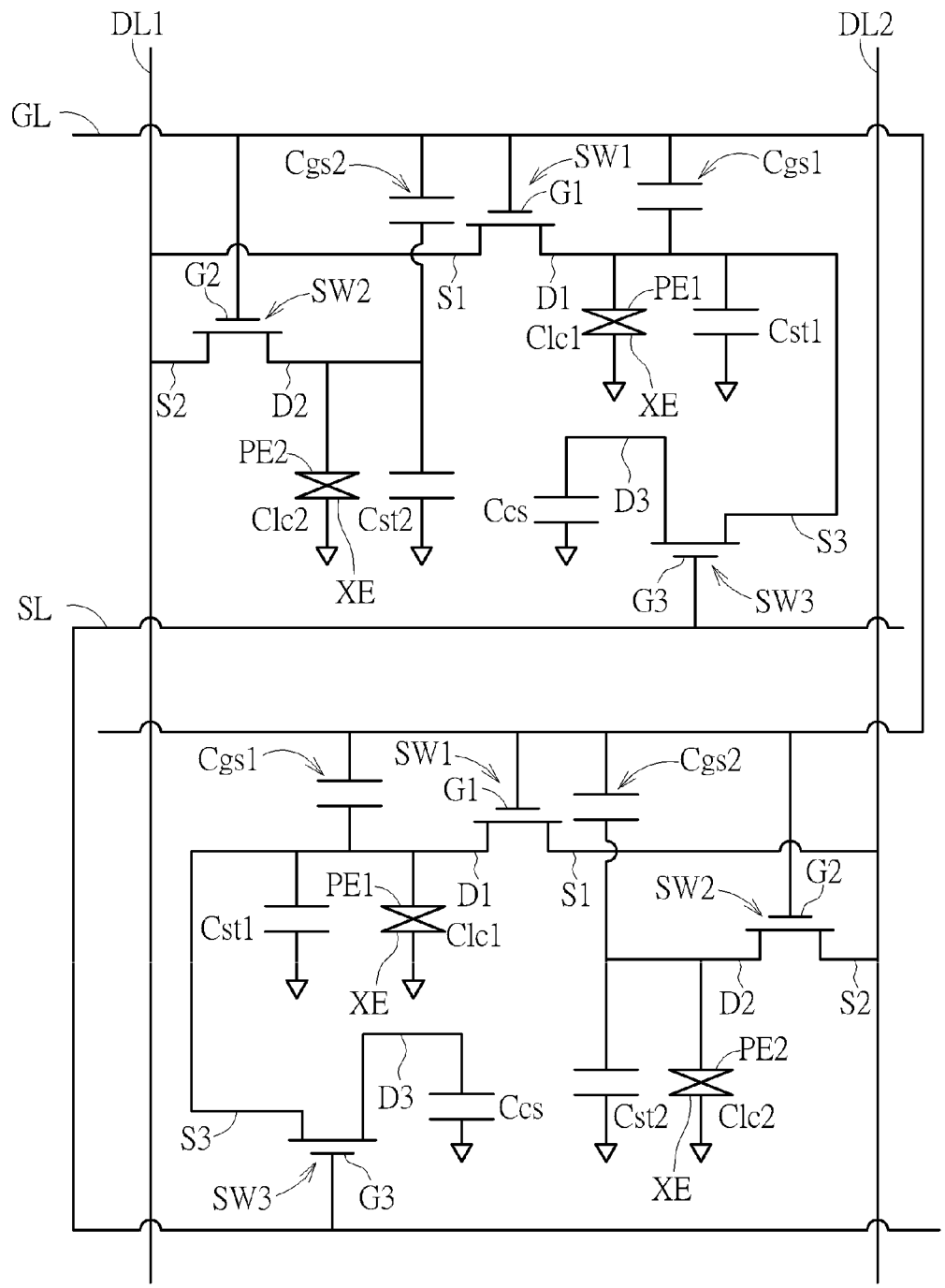
FIG. 19 is a schematic diagram illustrating an equivalent circuit of the pixel structure according to the third embodiment of the present disclosure.

Please refer to FIGS. 16-19. FIG. 16 is a schematic diagram illustrating a top view of a pixel structure according to a third embodiment of the present disclosure, FIG. 17 is a schematic diagram illustrating a cross-sectional view of the pixel structure taken along a line E-E' in FIG. 16, FIG. 18 is a schematic diagram illustrating a cross-sectional view of the pixel structure taken along a line F-F' in FIG. 16, and FIG. 19 is a schematic diagram illustrating an equivalent circuit of the pixel structure according to the third embodiment of the present disclosure. As shown in FIGS. 16-19, the difference between this embodiment and the second embodiment is that a pixel structure 3 of this embodiment is a pixel structure adopting a 2DHG driving method. Specifically, the first active devices SW1 and the second active devices SW2 located in a row (the first row for example) and the first active devices SW1 and the second active devices SW2 located in another adjoining row (for example the second row) receive the signals from the same gate line GL. The first active devices SW1 and the second active devices SW2 located in the row (the first row for example) are driven by the first data line DL1, and the first active devices SW1 and the second active devices SW2 located in another adjoining row (for example the second row) are driven by the second data line DL2. The pixel structure 3 of this embodiment further includes a signal line SL, a common line XL and a third active device SW3. The third active device SW3 is used for adjusting the pixel voltage of the first pixel electrode PE1. The third source electrode S3 is electrically connected to the first drain electrode D1. The third drain electrode D3 overlaps a portion of the common line XL in the vertical projection direction Z, and an adjusting capacitance Ccs is formed between the third drain electrode D3 and the common line XL. The pixel structure 3 of this embodiment is similar to the pixel structure 2 of the second embodiment, the specific disposition and the driving method are detailed in the second embodiment, and will not be redundantly described here. The pixel structure 3 of this embodiment may be the pixel structure of the first, second or third variant embodiment of the first embodiment according to different requirements.

The first data line DL1 is disposed between an overlapping portion of the first connecting electrode CE1 and the gate line GL. The first data line DL1 can be regarded as the screening electrode, and the first data line DL1 can effectively screen the electric field between the first connecting electrode CE1 and the gate line GL. In addition, the second gate to source capacitance Cgs2 can also be effectively reduced, so as to reduce the feed through voltage effect, and the pixel voltage of the pixel electrode can be maintained.

Therefore, the pixel structure 3 of this embodiment can provide the correct grey level and without the flicker phenomenon while displaying.

Figure 20:
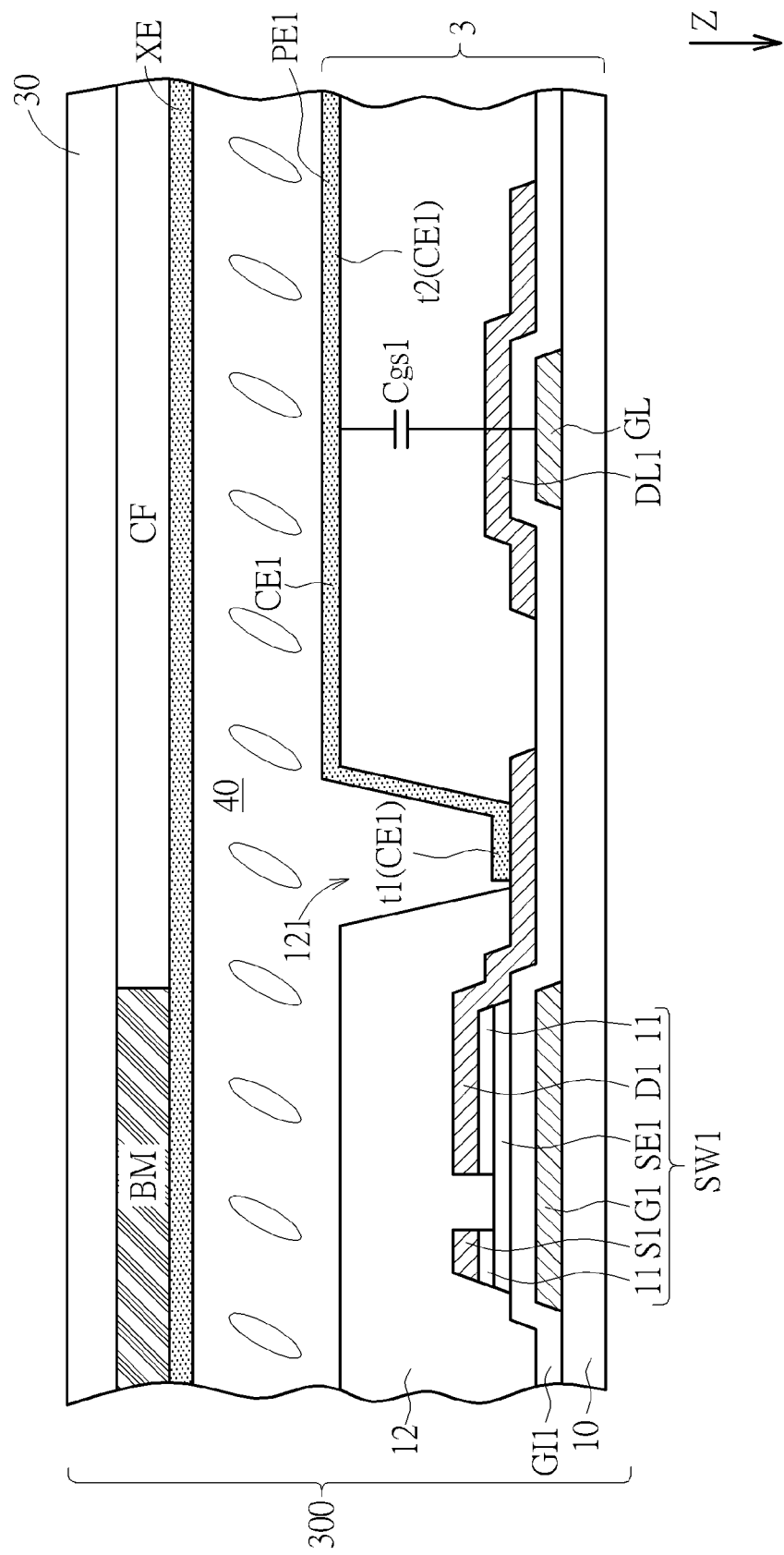
FIG. 20 is a schematic diagram illustrating a display panel according to the third embodiment of the present disclosure.

Please refer to FIG. 20, and refer to FIGS. 16-19 together. FIG. 20 is a schematic diagram illustrating a display panel according to the third embodiment of the present disclosure. As shown in FIG. 20, a display panel 300 of this embodiment includes the pixel structure 3 of the third embodiment (or the pixel structure of the other variant embodiments), a second substrate 30 and a display medium layer 40. The second substrate 30 is disposed opposite to the first substrate 10. The second substrate 30 may be a hard substrate (namely a rigid substrate or a firm substrate) or a flexible substrate (namely a bendable substrate) such as a glass substrate, a quartz substrate, a sapphire substrate, a plastic substrate or other suitable substrates. The display medium layer 40 is disposed between the first substrate 10 and the second substrate 30. The display medium layer 40 of this embodiment may be a liquid crystal layer, but not limited thereto. For example, the display medium layer 40 may also include a non-self-luminous display medium layer or a self-luminous display medium layer. The non-self-luminous display medium layer may be an electrowetting display medium layer or an electrophoretic display medium layer or other suitable non-self-luminous display medium layers. The self-luminous display medium layer may be an organic electroluminescence display medium layer, inorganic electroluminescence display medium layer, plasma display medium layer, field emission display medium layer, or other suitable self-luminous display medium layer. The common electrode XE of the display panel 300 of this embodiment may be disposed on the second substrate 30, and the display panel 300 may further include other elements such as a black matrix 32, a color filter layer CF, a spacer (not shown in the figures), an alignment film (not shown in the figures), and the function and the disposition of the above mentioned elements will not be redundantly described here. In addition, the display panel 300 of this embodiment may be a flat display panel, a curved display panel, a flexible display panel or other types of the display panels. The display panel 300 of this embodiment may further be combined with a backlight module to form a display device.

To summarize the above descriptions, in the pixel structure and the display panel of each of the embodiments and the variant embodiments of the present disclosure, the data line is disposed between the overlapping portion of the connecting electrode and the gate line. The data line is used as the screening electrode for screening the electric field between the connecting electrode and the gate line. In addition, the gate to source capacitance can be effectively reduced, so as to reduce the feed through voltage effect, and the pixel voltage of the pixel electrode can be maintained. Accordingly, the pixel structure and the display panel of each of the embodiments and the variant embodiments of the present disclosure can provide the correct grey level and without the flicker phenomenon while displaying.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A pixel structure, comprising:
a first substrate;
a gate line disposed on the first substrate, wherein the gate line has a first edge and a second edge;
a first data line disposed on the first substrate, wherein the first data line intersects the gate line;
a first pixel electrode disposed aside the first edge of the gate line;
a second pixel electrode disposed aside the second edge of the gate line;
a first active device disposed on the first substrate, wherein the first active device comprises:
 a first gate electrode connected to the gate line;
 a first semiconductor layer disposed corresponding to the first gate electrode, wherein the first semiconductor layer overlaps at least a portion of the first gate electrode in a vertical projection direction;
 a first gate insulating layer disposed between the first gate electrode and the first semiconductor layer; and
 a first source electrode and a first drain electrode respectively disposed at two sides of the first semiconductor layer, wherein the first source electrode is connected to the first data line, and the first drain electrode extends toward the second pixel electrode;
a second active device disposed on the first substrate, wherein the second active device comprises:
 a second gate electrode connected to the gate line;
 a second semiconductor layer disposed corresponding to the second gate electrode, wherein the second semiconductor layer overlaps at least a portion of the second gate electrode in the vertical projection direction;
 a second gate insulating layer disposed between the second gate electrode and the second semiconductor layer; and
 a second source electrode and a second drain electrode respectively disposed at two sides of the second semiconductor layer, wherein the second drain electrode extends toward the second pixel electrode;
at least one insulating layer covering the first active device and the second active device, wherein the at least one insulating layer has:
 a first contact hole exposing the first drain electrode; and
 a second contact hole exposing the second drain electrode;
a first connection electrode having a first end and a second end, wherein the first end of the first connection electrode is electrically connected to the first drain electrode through the first contact hole, the second end of the first connection electrode is electrically connected to the first pixel electrode, the first connection electrode is disposed on the insulating layer, and the first connection electrode overlaps the first data line in the vertical projection direction; and
a second connection electrode disposed aside the second edge of the gate line, wherein the second connection electrode is electrically connected to the second pixel electrode, and the second connection electrode is electrically connected to the second drain electrode through the second contact hole.

2. The pixel structure according to claim 1, wherein the first drain electrode and the second drain electrode protrude from the second edge of the gate line, and the first contact hole and the second contact hole are disposed aside the second edge of the gate line.

3. The pixel structure according to claim 1, wherein the first drain electrode, the second drain electrode and the first data line extend along a same direction.

4. The pixel structure according to claim 1, wherein the first connection electrode, the first data line and the gate line overlap one another in the vertical projection direction, the gate line and the first connection line include an overlapping portion, the first data line is disposed between the overlapping portion of the gate line and the first connection electrode, and the first connection electrode does not individually overlap the gate line in the vertical projection direction.

5. The pixel structure according to claim 1, wherein the first connection electrode and the second connection electrode belong to a patterned conductive layer, and the first drain electrode and the second drain electrode belong to another patterned conductive layer different from that of the first connection electrode and the second connection electrode.

6. The pixel structure according to claim 1, wherein the first connection electrode, the second connection electrode, the first pixel electrode and the second pixel electrode belong to a same patterned conductive layer.

7. The pixel structure according to claim 1, wherein the first pixel electrode and the second pixel electrode are disposed on the at least one insulating layer.

8. The pixel structure according to claim 1, wherein the second end of the first connection electrode is connected to a corner part of the first pixel electrode, and the corner part of the first pixel electrode is located adjoining to the first data line and the first edge of the gate line.

9. The pixel structure according to claim 1, wherein the first pixel electrode is a patterned electrode, and the patterned electrode comprises:
at least one main electrode; and
a plurality of branch electrodes, wherein an end of each of the branch electrodes is connected to the at least one main electrode, and a slit exists between two adjoining branch electrodes of the plurality of branch electrodes.

10. The pixel structure according to claim 9, wherein the first pixel electrode further comprises an auxiliary electrode, the auxiliary electrode is connected to the second end of the first connection electrode, and the auxiliary electrode is connected to the other ends of a portion of the branch electrodes.

11. The pixel structure according to claim 1, wherein the first pixel electrode is a full-surfaced electrode.

12. The pixel structure according to claim 1, further comprising a second data line disposed on the first substrate, wherein the second data line is electrically connected to the second drain electrode.

13. The pixel structure according to claim 1, wherein the second source electrode is electrically connected to the first source electrode.

14. The pixel structure according to claim 13, further comprising:
a signal line disposed on the first substrate, wherein the signal line is disposed between the gate line and the second pixel electrode;
a common line disposed on the first substrate, wherein the common line is disposed between the signal line and the second pixel electrode; and
a third active device disposed on the first substrate, wherein the third active device comprises:
a third gate electrode connected to the signal line;
a third semiconductor layer disposed corresponding to the third gate electrode, wherein the third semiconductor layer overlaps at least a portion of the third gate electrode in the vertical projection direction;
a third gate insulating layer disposed between the third gate electrode and the third semiconductor layer; and
a third source electrode and a third drain electrode disposed respectively at two sides of the third semiconductor layer, wherein the third source electrode is electrically connected to the first drain electrode, and the third drain electrode overlaps a portion of the common line in the vertical projection direction.

15. The pixel structure according to claim 1, wherein the at least one insulating layer comprises a color filter layer or a transparent insulating layer.

16. A display panel, comprising:
a plurality of pixel structures according to claim 1;
a second substrate disposed opposite to the first substrate; and
a display medium layer disposed between the first substrate and the second substrate.

* * * * *